US008232655B2

(12) United States Patent
Arvin et al.

(10) Patent No.: US 8,232,655 B2
(45) Date of Patent: Jul. 31, 2012

(54) BUMP PAD METALLURGY EMPLOYING AN ELECTROLYTIC CU / ELECTORLYTIC NI / ELECTROLYTIC CU STACK

(75) Inventors: Charles L. Arvin, Poughkeepsie, NY (US); Hai P. Longworth, Poughkeepsie, NY (US); David J. Russell, Apalachin, NY (US); Krystyna W. Semkow, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 625 days.

(21) Appl. No.: 11/968,663

(22) Filed: Jan. 3, 2008

(65) Prior Publication Data

US 2009/0174045 A1 Jul. 9, 2009

(51) Int. Cl.
*H01L 23/495* (2006.01)
*H01L 21/44* (2006.01)
(52) U.S. Cl. ......... 257/781; 257/676; 257/750; 257/766
(58) Field of Classification Search .................. 257/676, 257/690, E23.031, E21.476, 750, 766, 781
See application file for complete search history.

(56) References Cited

U.S. PATENT DOCUMENTS

| | | | | |
|---|---|---|---|---|
| 5,100,714 A | * | 3/1992 | Zsamboky | 428/137 |
| 5,719,070 A | * | 2/1998 | Cook et al. | 438/614 |
| 5,937,320 A | * | 8/1999 | Andricacos et al. | 438/614 |
| 6,103,552 A | * | 8/2000 | Lin | 438/113 |
| 6,249,053 B1 | * | 6/2001 | Nakata et al. | 257/738 |
| 6,290,860 B1 | * | 9/2001 | Appelt et al. | 216/17 |
| 6,391,210 B2 | * | 5/2002 | Appelt et al. | 216/13 |
| 6,413,851 B1 | * | 7/2002 | Chow et al. | 438/613 |
| 6,486,551 B1 | * | 11/2002 | Sato et al. | 257/737 |
| 6,495,394 B1 | * | 12/2002 | Nakata et al. | 438/107 |
| 6,501,185 B1 | * | 12/2002 | Chow et al. | 257/780 |
| 6,515,233 B1 | | 2/2003 | Labzentis et al. | |
| 6,596,621 B1 | * | 7/2003 | Copeland et al. | 438/614 |
| 6,716,738 B2 | * | 4/2004 | Kim et al. | 438/612 |
| 6,828,224 B2 | * | 12/2004 | Iijima et al. | 438/622 |
| 6,858,475 B2 | * | 2/2005 | Gurumurthy et al. | 438/128 |
| 6,891,198 B2 | * | 5/2005 | Matsumura et al. | 257/81 |

(Continued)

OTHER PUBLICATIONS

Maheshwari et al., "High-Resolution Thin-Film Device to Sense Texture by Touch", Science Magazine, Jun. 9, 2006, pp. 1501-1504, vol. 312, No. 5779.

*Primary Examiner* — Ha Tran T Nguyen
*Assistant Examiner* — Jordan Klein
(74) *Attorney, Agent, or Firm* — Scully, Scott, Murphy & Presser, P.C.; Joseph Petrokaitis, Esq.

(57) ABSTRACT

An electroless Cu layer is formed on each side of a packaging substrate containing a core, at least one front metal interconnect layer, and at least one backside metal interconnect layer. A photoresist is applied on both electroless Cu layers and lithographically patterned. First electrolytic Cu portions are formed on exposed surfaces of the electroless Cu layers, followed by formation of electrolytic Ni portions and second electrolytic Cu portions. The electrolytic Ni portions provide enhanced resistance to electromigration, while the second electrolytic Cu portions provide an adhesion layer for a solder mask and serves as an oxidation protection layer. Some of the first electrolytic Cu may be masked by lithographic means to block formation of electrolytic Ni portions and second electrolytic Cu portions thereupon as needed. Optionally, the electrolytic Ni portions may be formed directly on electroless Cu layers.

20 Claims, 17 Drawing Sheets

U.S. PATENT DOCUMENTS

| | | |
|---|---|---|
| 6,956,292 B2 | 10/2005 | Fan et al. |
| 6,992,389 B2 * | 1/2006 | Andricacos et al. ........... 257/746 |
| 7,038,142 B2 * | 5/2006 | Abe .............................. 174/255 |
| 7,193,157 B2 * | 3/2007 | Matsuda et al. ............... 174/254 |
| 7,199,036 B2 * | 4/2007 | Chan et al. .................... 438/613 |
| 7,205,482 B2 | 4/2007 | Naito et al. |
| 2002/0093096 A1 * | 7/2002 | Tago et al. .................... 257/738 |
| 2003/0011070 A1 * | 1/2003 | Iijima et al. ................... 257/734 |
| 2004/0072387 A1 * | 4/2004 | Hong et al. ................... 438/108 |
| 2004/0231141 A1 * | 11/2004 | Nishinaka et al. .............. 29/609 |
| 2005/0116143 A1 * | 6/2005 | Watanabe et al. .......... 250/214.1 |
| 2007/0188270 A1 * | 8/2007 | Ohara et al. .................. 333/189 |

* cited by examiner

US 8,232,655 B2

BUMP PAD METALLURGY EMPLOYING AN ELECTROLYTIC CU / ELECTORLYTIC NI / ELECTROLYTIC CU STACK

FIELD OF THE INVENTION

The present invention relates to semiconductor structures, and particularly to a bump pad metallurgy structure employing a stack of electrolytic Cu/electrolytic Ni/electrolytic Cu and methods of forming the same.

BACKGROUND OF THE INVENTION

Once formation of semiconductor devices and interconnect structures on a semiconductor wafer (substrate) is completed, the semiconductor wafer is diced into semiconductor chips, or "dies." Functional semiconductor chips are then packaged to facilitate mounting on a circuit board. A package is a supporting element for the semiconductor chip that provides mechanical protection and electrical connection to an upper level assembly system such as the circuit board. Two types of packaging technologies are commonly available. The first type is wire bonding that employs bonding pads and solder bumps on the semiconductor chip and on a wirebond package. Bonding wires connect pairs of bonding pads across the semiconductor chip and the wirebond package to provide electrical connection between them. The second type is Controlled Collapse Chip Connection (C4) packaging, which employs C4 balls each of which contacts a C4 pad on the semiconductor chip and another C4 pad on a packaging substrate. Both types of packaging technologies provide a packaged semiconductor chip which may be assembled on the circuit board.

Typically, a semiconductor chip having a large number of input/output (I/O) pins employs C4 packaging since C4 packaging can handle a higher density of pins than wire bonding packages. FIG. 1 shows a prior art packaging substrate comprising a core 3 at the center, multiple vertically stacked front metal interconnect layers 5 located above the core 3, multiple front insulator layers 4 interspersed between the front metal interconnect layers 5 and above the core 3, multiple vertically stacked backside metal interconnect layers 7, and multiple back insulator layers 6 interspersed between the backside metal interconnect layers 7. Each of the front insulator layers 4 provides electrical isolation between a pair of neighboring front metal interconnect layers 5. Likewise, each of the back insulator layers 6 provides electrical isolation between a pair of neighboring backside metal interconnect layers 7. Typically, the number of front metal interconnect layers 5 matches the number of the backside metal interconnect layers 7. Recent activity with organic laminates has been to eliminate the core. The presence or lack of a core does not change how this invention works.

The packaging substrate facilitates formation of an electrical link between the semiconductor chip and a system board of a computer. A semiconductor chip is mounted on a die foot print area 2 located on a top surface of the packaging substrate. The die foot print area 2 contains C4 pads on which a semiconductor chip (not shown) may be attached by C4 bonding. The area of the top surface of the packaging substrate outside of the die foot print area 2 is referred to as a packaging substrate top surface 1.

A typical semiconductor chip employing a packaging substrate may comprise about 5,000 input/output nodes. Each of these nodes are electrically connected to a C4 pad on a top surface of the semiconductor chip in a two dimensional array. Typical two dimensional array configurations for the C4 pads include 4 on 8 configuration, which employs C4 solder balls having a diameter of 4 mils (~100 microns) and a pitch of 8 mils (~200 microns) in a rectangular array, and 3 on 6 configuration, which employs C4 solder balls having a diameter of 3 mils (~75 microns) and a pitch of 6 mils (~150 microns) in a rectangular array. Thus, more than 5,000 C4 solder balls may be formed on the semiconductor chip, which may be typically about 2 cm×2 cm in size.

The front metal interconnect layers 5 and the backside metal interconnect layers 7 provide electrical connections from the C4 pads on the die foot print area 2 to the bottom of the packaging substrate which contains ball grid array (BGA) pads having a larger dimension than the C4 pads. Typically, BGA pads are in a rectangular array having a pitch on the order of about 1 mm. BGA solder balls having a diameter of about 400 microns are used to attach the packaging substrate to the system board. Typically, Sn—Ag—Cu alloys, which are free of lead, are employed to meet emerging standards for reducing hazardous materials. Alternative methods to BGA connection are to employ a land grid array (LGA) in which a thin pad containing metal points in a grid are placed between the system board and the packaging substrate or to utilize pins. Use of the LGA or pins facilitates easy removal of a packaging substrate containing expensive electronics for repair purposes.

The packaging substrate also protects the semiconductor chip that is mounted on the die foot print area 2 and modularizes the product development of the semiconductor chip, while simplifying the subsequent integration steps involved in the manufacturing of a larger computer or a consumer electronic product. Ceramic materials or organic materials may be employed for building up a packaging substrate. Ceramic substrates are built layer by layer without the need of a core where as organic substrates require a core on which the front and back layers can be built. While ceramic materials offer excellent mechanical strength and a low level of warp relative to organic materials, there is an inherent limitation in wiring density posed by ceramic substrate. It necessarily requires a larger number of buildup layers (by a factor of 5 to 10) than that required by an organic substrate In contrast, an organic substrate facilitates high density wiring in the front metal interconnect layers 5 and the backside metal interconnect layers 7, i.e., a packaging substrate employing an organic material for the core 3, the top insulator layers 4, and the bottom insulator layers 6. Typically, approximately 16 levels of the front metal interconnect layers 5 and the backside metal interconnect layers 7 may accommodate the contents of the electrical wiring in 100 levels in a ceramic package.

The C4 pads on the die foot print area 2 accommodate C4 balls that provide electrical connection to the semiconductor chip. High current through the C4 balls during the operation of the semiconductor chip, however, raises reliability issues of the C4 pads formed on the packaging substrate. In this regard, a key reliability concern is susceptibility of the C4 balls and C4 pads to electromigration. Electromigration is the transport of material caused by the gradual movement of the metal ions in a metallic conductor due to the momentum transfer by electrons conducting electrical current. In time, electromigration may cause an open between a C4 pad and a C4 ball.

When Cu of a C4 pad and Sn of a C4 ball are in direct contact, as is the case in prior art C4 structures, Cu is available to readily diffuse into the C4 ball, which comprises a Sn based solder, during thermal cycles which leaves behind Kirkendall voids, which are voids induced by diffusion in an alloy of two metals that have different interdiffusion coefficients. These Kirkendall voids enhance the transport of Cu. This further increases probability of interfacial void formation at the interface between the C4 pad and the C4 ball. Thus, the rate of Cu transport into the solder accelerates once voids form, and may cause a reliability failure of the electrical connection between the semiconductor chip and the packaging substrate.

The composition of metallic layers employed in the C4 pads to attach a C4 ball is called a bump pad metallurgy in the art. In view of the above, there exists a need for a bump pad metallurgy that provides enhanced reliability of C4 bonding structures between a semiconductor chip and a packaging substrate.

The industry has used and continues to use a bump pad metallurgy of electroless NiP/Au. This bump pad metallurgy does not require electrical connection to deposit. However, it has three significant drawbacks. The first is that the deposit needs to be made homogenous after plating. This is done with a furnace step and adds additional processing requirements. The second is that due to the ability of the bath to plate on many surfaces, the bath must be maintained within tight process controls. This requires heavy maintenance of the bath and eventual dumping. The third is that upon interaction with the solder, the Ni will react but the P will not. This leads to the phenomenon known as "black pad". This "black pad" is brittle and can lead to mechanical failure that causes an electrical open to form.

In view of the above, there exists a need for a bump pad metallurgy for a packaging substrate for reducing electromigration between a C4 pad and a C4 ball and structures and methods for implementing the same.

SUMMARY OF THE INVENTION

The present invention addresses the needs described above by providing a method of forming a bump pad metallurgy structure which contains a stack of electrolytic Cu/electrolytic Ni/electrolytic Cu and having a higher resistance to electromigration and providing enhanced reliability of C4 structures.

In the present invention, an electroless Cu layer is formed on each side of a packaging substrate containing a core, at least one front metal interconnect layer, and at least one backside metal interconnect layer. A photoresist is applied on both electroless Cu layers and lithographically patterned. First electrolytic Cu portions are formed on exposed surfaces of the electroless Cu layers, followed by formation of electrolytic Ni portions and second electrolytic Cu portions. The electrolytic Ni portions provide enhanced resistance to electromigration, while the second electrolytic Cu portions provide an adhesion layer for a solder mask and serves as an oxidation protection layer. Some of the first electrolytic Cu may be masked by lithographic means to block formation of electrolytic Ni portions and second electrolytic Cu portions thereupon as needed. Optionally, the electrolytic Ni portions may be formed directly on electroless Cu layers.

According to an aspect of the present invention, a packaging substrate for mounting a semiconductor chip is provided. The packaging substrate comprises:

a core;

a front metal interconnect layer containing front metal interconnect components and an insulator material and located on and above a top surface of the core;

a backside metal interconnect layer containing backside metal interconnect components and the insulator material and located on and below a bottom surface of the core; and a C4 pad comprising an electrolessly plated Cu portion abutting the front metal interconnect layer, a first electrolytic Cu portion abutting the electrolessly plated Cu portion, an electrolytic Ni portion abutting the first electrolytic Cu portion, and a second electrolytic Cu portion abutting the electrolytic Ni portion.

According to another aspect of the present invention, another packaging substrate for mounting a semiconductor chip is provided. The packaging substrate comprises:

a core;

a front metal interconnect layer containing front metal interconnect components and an insulator material and located on and above a top surface of the core;

a backside metal interconnect layer containing backside metal interconnect components and the insulator material and located on and below a bottom surface of the core; and a C4 pad comprising an electrolessly plated Cu portion abutting the front metal interconnect layer, an electrolytic Ni portion abutting the electrolessly plated Cu portion, and an electrolytic Cu portion abutting the electrolytic Ni portion.

According to yet another aspect of the present invention, a method of forming a packaging substrate for mounting a semiconductor chip is provided. The method comprises:

forming a core;

forming a front metal interconnect layer containing front metal interconnect components and an insulator material and located on and above a top surface of the core;

forming a backside metal interconnect layer containing backside metal interconnect components and the insulator material and located on and below a bottom surface of the core; and forming a C4 pad comprising an electrolytic Ni portion on the front metal interconnect layer.

DETAILED DESCRIPTION OF THE INVENTION

As stated above, the present invention relates to a bump pad metallurgy structure employing a stack of electrolytic Cu/electrolytic Ni/electrolytic Cu and methods of forming the same, which are now described in detail with accompanying figures. It is noted that figures are schematic and not necessarily drawn to scale.

Figure 1:
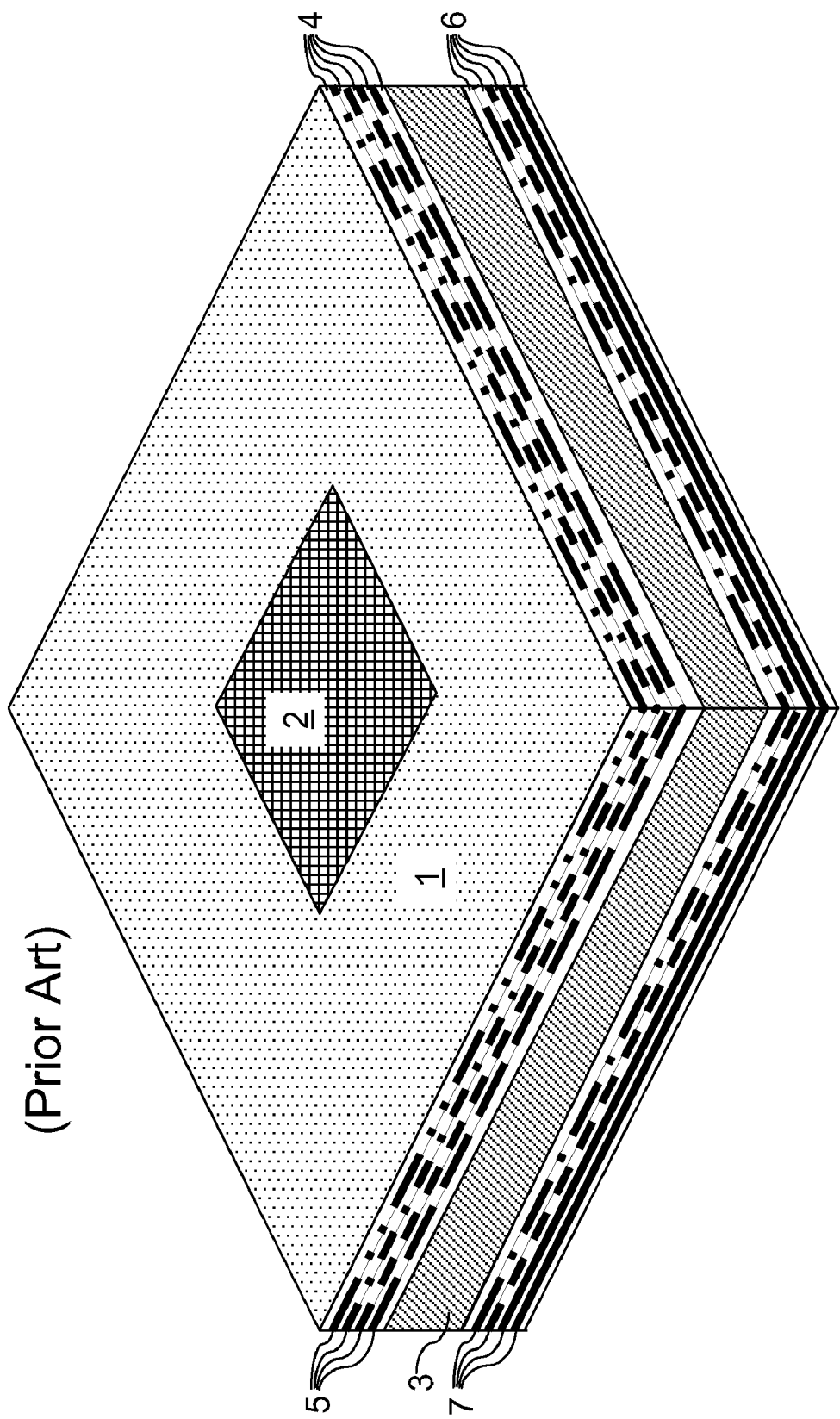
FIG. 1 shows a prior art packaging substrate having a die foot print area 12 for attaching a semiconductor chip.
Figure 2:
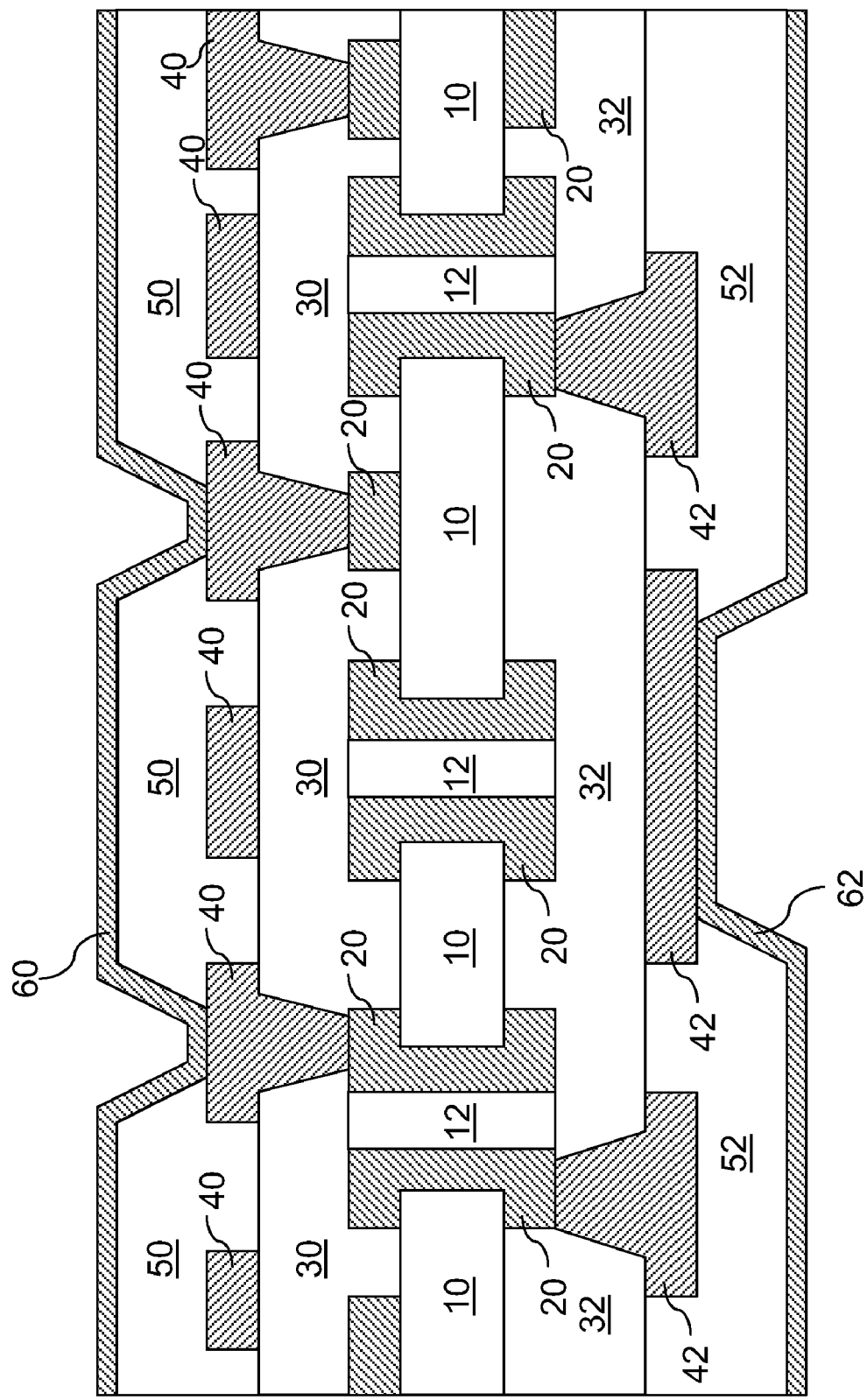
FIGS. 2-9 shows sequential vertical cross-sectional views of a first exemplary packaging substrate for mounting a semiconductor chip at various stages of a manufacturing sequence.

Referring to FIG. 2, a first exemplary packaging substrate according to a first embodiment of the present invention comprises a core 10, through-core cylinders 12, core-level metal portions 20, an inner front insulator layer 30, an inner backside insulator layer 32, front metal interconnect components 40, backside metal interconnect components 42, a topmost front insulator layer 50, a bottommost backside insulator layer 52, a front electrolessly plated Cu layer 60, and a backside electrolessly plated Cu layer 62. Metal interconnect components and an insulator layer within the same level constitute a metal interconnect layer. For example, the front metal interconnect components 40 and the topmost front insulator layer 50 collectively constitute a front metal interconnect layer (40, 50), and the bottommost backside insulator layer 52 and the backside metal interconnect components 42 collectively constitute a backside metal interconnect layer (42, 52). Additional front metal interconnect layers, which are termed "inner front metal interconnect layers," may be present between the front metal interconnect layer (40, 50) and the core 10, and additional backside metal interconnect layers, which are termed "inner backside metal interconnect layer," may be present between the backside metal interconnect layer (42, 52) and the core 10.

Methods of forming the front metal interconnect layer (40, 50) and the backside metal interconnect layer (42, 52) on the core is well known in the art. The core 10 comprises an insulator material, which may be an organic material, silicon, or a ceramic material. The organic material may be reinforced with fiberglass. Also, the organic material may comprise a resin material. In case the insulator material of the core 10 comprises a ceramic material, the first exemplary packaging substrate is a ceramic packaging substrate. In case the insulator material of the core 10 comprises an organic material, the first exemplary packaging substrate is an organic packaging substrate. In case silicon is employed, the silicon is substantially intrinsic, i.e., substantially undoped, to prevent any substantial electrical conduction therethrough. The present invention may be practiced irrespective of the types of packaging substrates.

Core level metal portions 20 are formed by electroless plating of a metal layer, which typically comprises Cu, followed by application and patterning of a photoresist and an etch that removes exposed portions of the metal layer. Core cylinders 12 comprising an insulator material is formed within holes of core level metal portions 20 that are formed through the core 10. A blanket layer of an insulator material is applied on both sides of the core 10 now containing the core level metal portions 20 and the core cylinders 12, and pressed together at an elevated temperature, e.g., at about 200° C., to form a laminated structure containing an inner front insulating layer 30, the core 10 along with core level metal portions 20 and the core cylinders 12, and an inner backside insulating layer 32.

The insulator material of the inner front insulating layer 30 and the inner backside insulating layer 32 may be a ceramic material in the case of a ceramic packaging substrate, or may be an organic material such as a resin material. Vias may be formed in the inner front insulating layer 30 and the inner backside insulating layer 32 to expose underlying metal interconnect components, e.g., the core level metal portions 20. Multiple layers of inner front metal interconnect layers and inner backside metal interconnect layers may be formed by repetition of formation of a metal layer by electroless plating, lithographic patterning thereof to form inner metal interconnect components, application and adhesion of a blanket layer of an insulator material to form an additional inner insulator layer, and formation of vias in the additional inner insulator layer to exposed portions of the inner metal interconnect components.

An inner insulator layer on the front side, herein termed an "inner front insulator layer," and a set of inner metal interconnect components on the front side, herein termed "inner front metal interconnect components," formed at the same level constitute an inner front metal interconnect layer. The set of inner front metal interconnect layers constitute front circuit build-up layers. An inner insulator layer on the back side, herein termed an "inner backside insulator layer," and a set of inner metal interconnect components on the back side, herein termed "inner backside metal interconnect components," formed at the same level constitute an inner backside metal interconnect layer. The set of inner backside metal interconnect layers constitute backside circuit build-up layers. Typically, a pair of an inner front metal interconnect layer and inner backside insulator layer are formed simultaneously, and this process is repeated until the front and backside circuit build-up layers are completed.

Front metal interconnect components 40 are formed on a topmost layer of the inner front insulator layers, which is represented by the inner front insulator layer 30, by formation of a metal layer by electroless plating and lithographic patterning thereof. Likewise, backside metal interconnect components 42 are formed on a bottommost layer of the inner backside insulator layers, which is represented by the inner backside insulator layer 32, by formation of a metal layer by electroless plating and lithographic patterning thereof. As discussed above, formation of multiple inner front metal interconnect layers and inner backside metal interconnect layers instead of a single inner front insulator layer 30 and a single inner backside insulator layer 32 is explicitly contemplated herein. A topmost front insulator layer 50 is formed on the front metal interconnect components 40, and a bottommost backside insulator layer 52 is formed on the backside metal interconnect components 42. Front vias are formed in the topmost front insulator layer 50 to expose portions of the front metal interconnect components 40, and backside vias are formed in the bottommost backside insulator layer 52. The front metal interconnect layer (40, 50) comprises the front metal interconnect components 40 and the topmost front insulator layer 50. The backside metal interconnect layer (42, 52) comprises the backside metal interconnect components 42 and the bottommost backside insulator layer 52.

A front electrolessly plated Cu layer 60 and a backside electrolessly plated Cu layer 62 are formed on the front metal interconnect layer (40, 50) and the backed metal interconnect layer (42, 52), respectively, by electroless plating of Cu. The thickness of the front electrolessly plated Cu layer 60 and the backside electrolessly plated Cu layer 62 may be from about 0.1 µm to about 2.0 µm, although lesser and greater thicknesses are also contemplated herein. The density of the front electrolessly plated Cu layer 60 and the backside electrolessly plated Cu layer 62 is about 8.82 g/cm$^3$, which is the density of electrolessly plated Cu. Electrolessly plated Cu comprises atomic scale voids in the structure, and thus has a lower density than the density of Cu in normal elemental form, which is between 8.92 g/cm$^3$ (CRC 1$^{st}$ Student Edition 1987) and 8.96 g/cm$^3$ (CRC 87$^{th}$ Edition 2006) at room temperature. Formation of such voids during electroless plating of Cu is known to be an inherent limitation of the electroless plating processes currently available for Cu. Preferably, the front electrolessly plated Cu layer 60 covers the entirety of the surface of the front metal interconnect layer (40, 50), and the backside electrolessly plated Cu layer 62 covers the entirety of the surface of the backside metal interconnect layer (42, 52).

Figure 3:
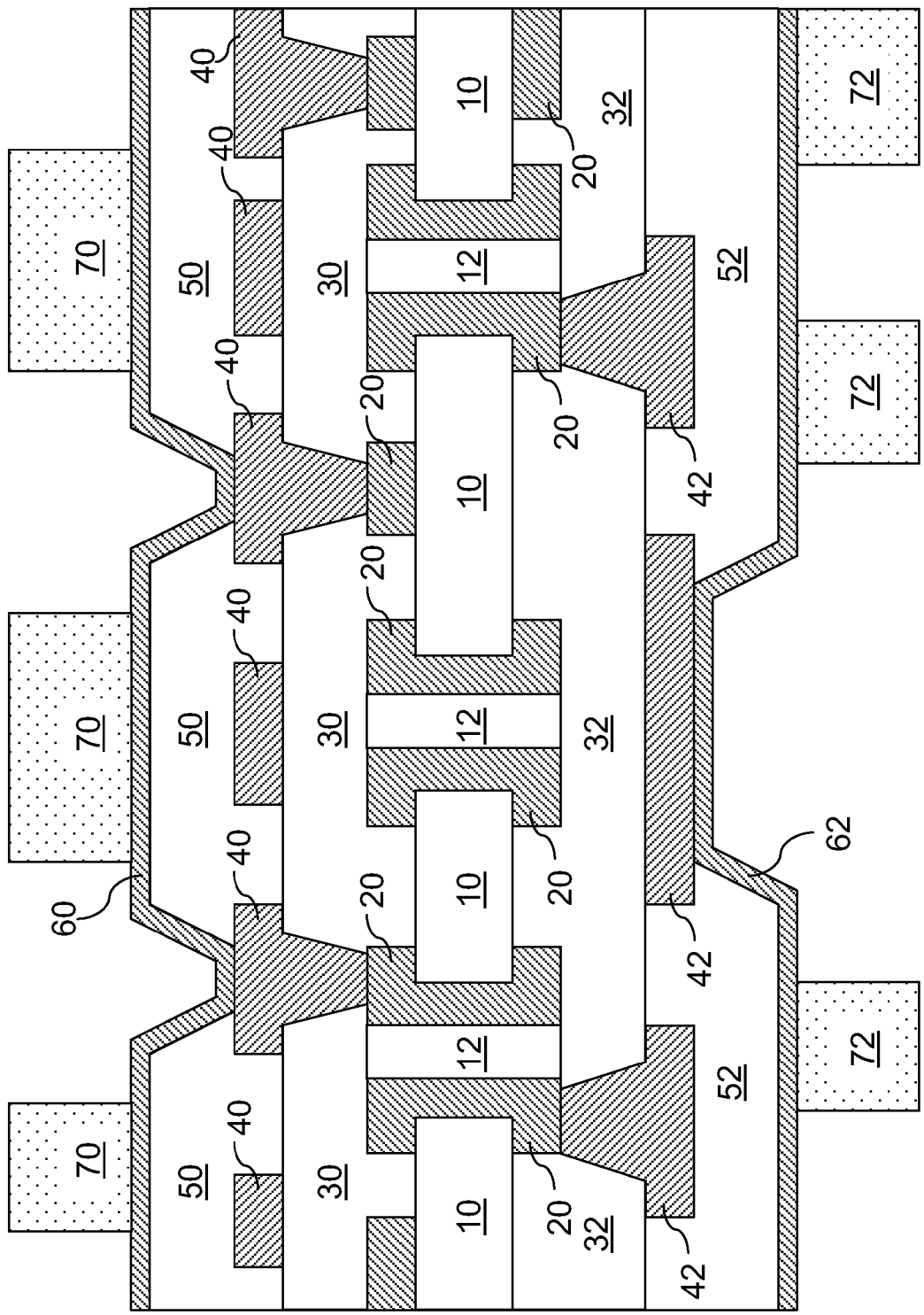

Referring to FIG. 3, a front photoresist 70 is applied to the front electrolessly plated Cu layer 60, and a backside photoresist 72 is applied to the backside electrolessly plated Cu layer 62. The front photoresist 70 is lithographically patterned to exposed portions of the front electrolessly plated Cu layer 60, while blocking other portions of the front electrolessly plated Cu layer 60. Likewise, the backside photoresist 72 is lithographically patterned to exposed portions of the backside electrolessly plated Cu layer 62, while blocking other portions of the backside electrolessly plated Cu layer 62. Some of the exposed portions of the front electrolessly plated Cu layer 60 are large enough to subsequently form a C4 pad that accommodates a C4 ball. Some of the exposed portions of the backside electrolessly plated Cu layer 62 are large enough to subsequently form a ball grid array (BGA) pad that accommodates a BGA ball.

Figure 4:
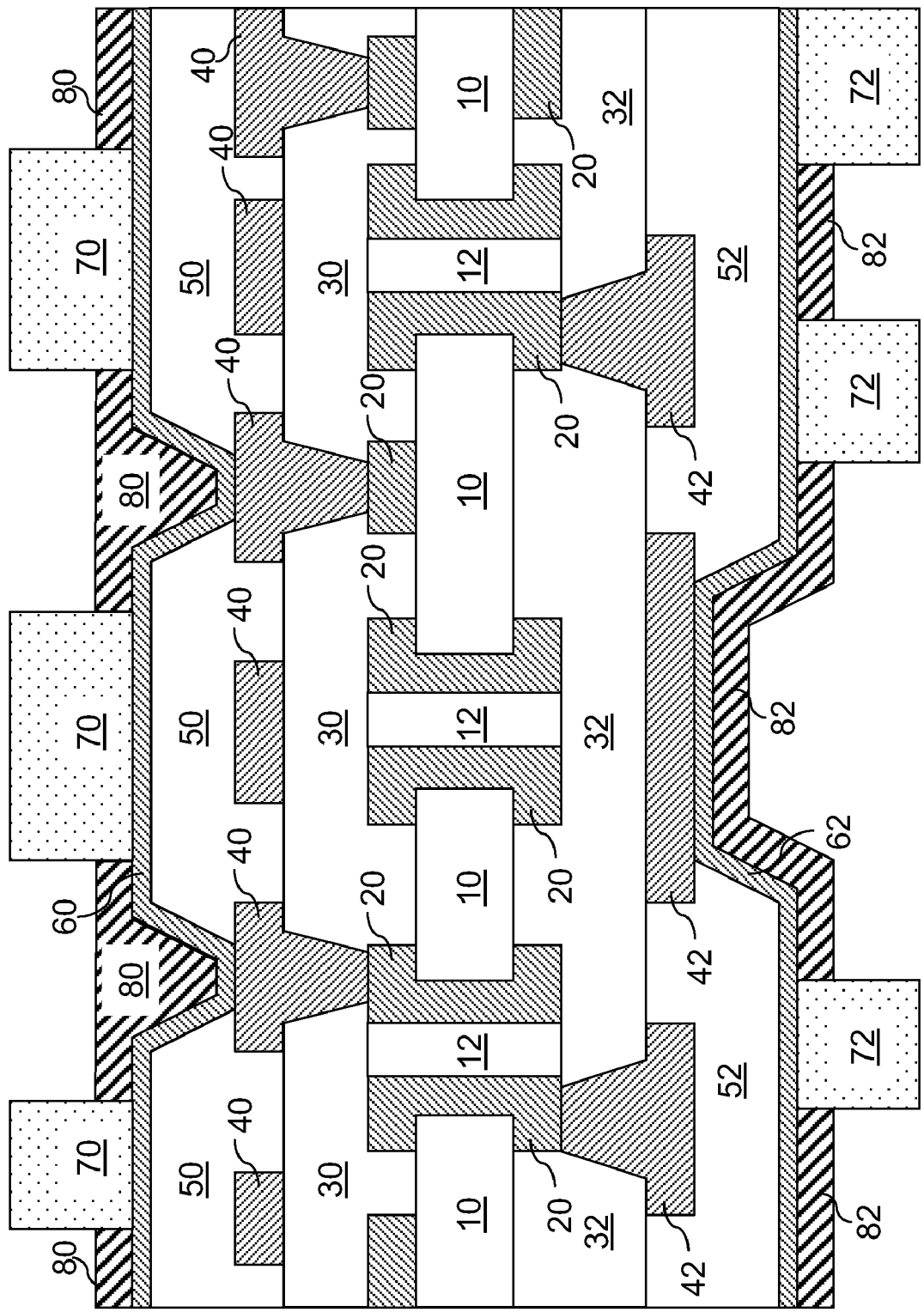

Referring to FIG. 4, first front electrolytic Cu portions 80 are formed on exposed surfaces of the front electrolessly plated Cu layer 60 and first backside electrolytic Cu portions 82 are formed on the backside electrolessly plated Cu layer 62 by electrolytic plating of Cu on exposed surfaces of Cu. The front photoresist 70 and the backside photoresist 72 define the area in which the first front electrolytic Cu portions 80 and the first backside electrolytic Cu portions 82 are formed. The sidewalls of the first front electrolytic Cu portions 80 and the first backside electrolytic Cu portions 82 coincide with the sidewalls of the front photoresist 70 or the backside photoresist 72. The first front electrolytic Cu portions 80 and the first backside electrolytic Cu portions 82 may be formed simultaneously in an electrolytic plating bath. The thickness of the first front electrolytic Cu portions 80 and the first backside electrolytic Cu portions 82 may be from about 0.5 µm to about 20 µm on the lines and from about 0.5 um to 40 um within the via, although lesser and greater thicknesses are also contemplated herein.

The density of the first front electrolytic Cu portions 80 and the first backside electrolytic Cu portions 82 is about 8.91 g/cm$^3$, which is the density of electrolytically plated Cu. Electrolytically plated Cu comprises much less atomic scale voids in the structure than electrolessly plated Cu, and thus has a higher density than the density of electrolessly plated Cu. The density of electrolytically plated Cu, which is about 8.91 g/cm$^3$, is marginally lower than the density of Cu in normal elemental form, which is 8.92 to 8.96 g/cm$^3$ at room temperature. Thus, the density of the first front electrolytic Cu portions 80 and the first backside electrolytic Cu portions 82 is equal to or greater than 8.91 g/cm$^3$ at room temperature, while the density of the front electrolessly plated Cu layer 60 and the backside electrolessly plated Cu layer 62 is less than 8.90 g/cm$^3$. Such differences in the density of electrolytically plated Cu and electrolessly plated Cu are inherent due to the different reaction mechanisms for formation of Cu deposits employed in an electrolytic plating process and an electroless plating process.

Figure 5:
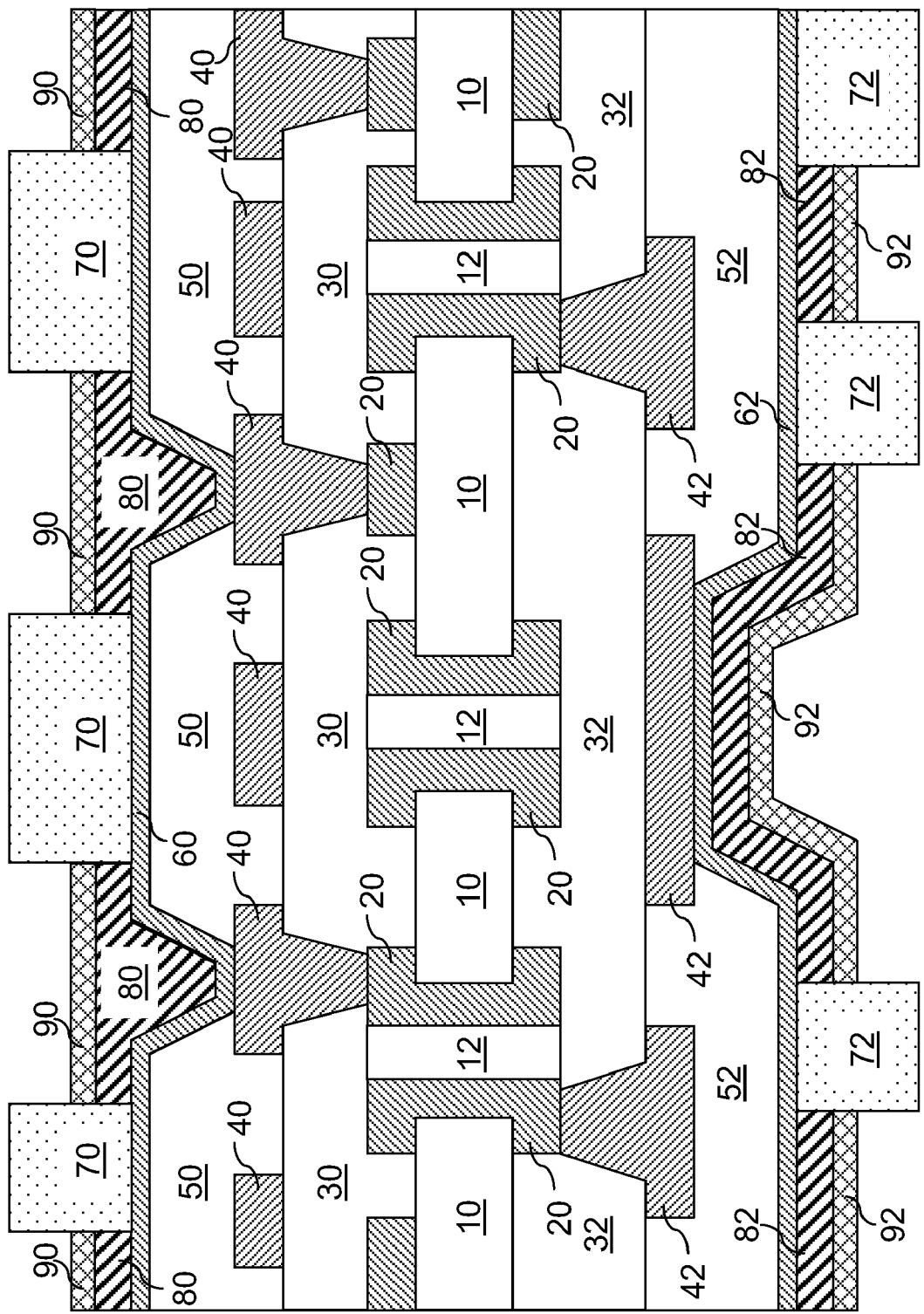

Referring to FIG. 5, front electrolytic Ni portions 90 are formed on exposed surfaces of the first front electrolytic Cu portions 80 and backside electrolytic Ni portions 92 are formed on the first backside electrolytic Cu portions 82 by electrolytic plating of Ni on exposed surfaces of Cu. The front photoresist 70 and the backside photoresist 72 define the area in which the front electrolytic Ni portions 90 and the backside electrolytic Ni portions 92 are formed. The sidewalls of the front electrolytic Ni portions 90 and the backside electrolytic Ni portions 92 coincide with the sidewalls of the front photoresist 70 or the backside photoresist 72. The front electrolytic Ni portions 90 and the backside electrolytic Ni portions 92 may be formed simultaneously in an electrolytic plating bath. The thickness of the front electrolytic Ni portions 90 and the backside electrolytic Ni portions 92 may be from about 0.5 µm to about 4.0 µm, although lesser and greater thicknesses are also contemplated herein.

The front electrolytic Ni portions 90 and the backside electrolytic Ni portions 92 comprise at least 99.0% elemental Ni. Preferably, the front electrolytic Ni portions 90 and the backside electrolytic Ni portions 92 comprise at least 99.9% elemental Ni. Even more preferably, the front electrolytic Ni portions 90 and the backside electrolytic Ni portions 92 comprise at least 99.95% elemental Ni. The density of the front electrolytic Ni portions 90 and the backside electrolytic Ni portions 92 is greater than 8.80 g/cm$^3$ and is substantially the same as the density of elemental Ni, which is about 8.91 g/cm$^3$ at room temperature.

The density of the front electrolytic Ni portions 90 and the backside electrolytic Ni portions 92 is greater than the density of Ni formed by electroless plating, which forms a Ni/P compound containing P from about 5% to about 14% in weight percentage. In other words, the material commonly referred to as "electrolessly plated Ni" is not a high purity Ni compound, but necessarily contains a high percentage P due to the use of phosphoric acid ($H_3PO_4$) in a plating bath. Thus, the electrolytically plated Ni of the present invention is distinguished from electrolessly plated Ni in that the purity of Ni is much higher than what is normally obtainable by electroless plating. Because of such high purity, the density of the front electrolytic Ni portions 90 and the backside electrolytic Ni portions 92 approaches the density of elemental Ni in pure form, and has a density greater than 8.80 g/cm$^3$, and typically greater than 8.89 g/cm$^3$.

Figure 6:
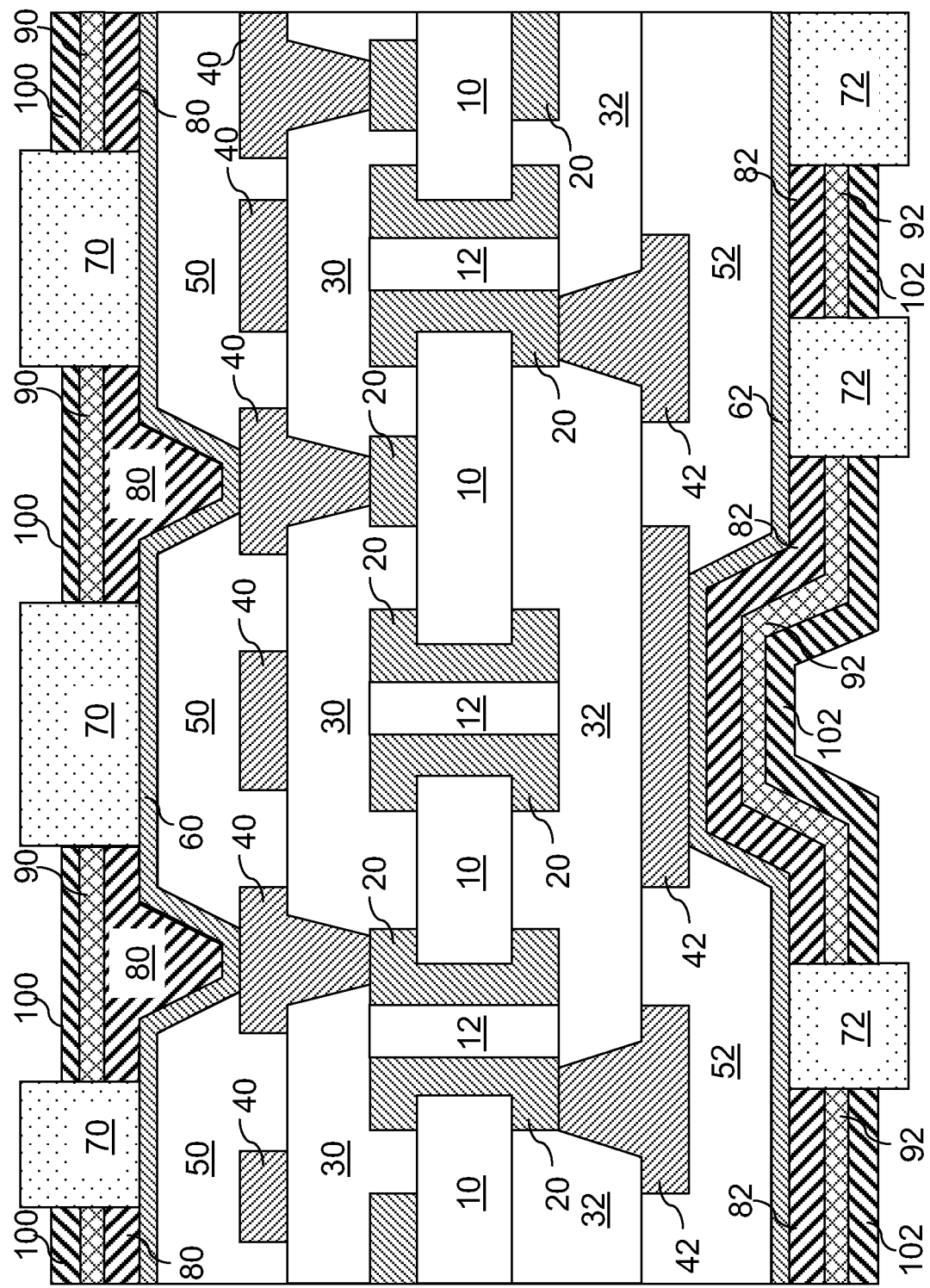

Referring to FIG. 6, second front electrolytic Cu portions 100 are formed on exposed surfaces of the front electrolytic Ni portions 90 and second backside electrolytic Cu portions 102 are formed on the backside electrolytic Ni portions 92 by electrolytic plating of Cu on exposed surfaces of Ni. The front photoresist 70 and the backside photoresist 72 define the area in which the second front electrolytic Cu portions 100 and the second backside electrolytic Cu portions 102 are formed. The sidewalls of the second front electrolytic Cu portions 100 and the second backside electrolytic Cu portions 102 coincide with the sidewalls of the front photoresist 70 or the backside photoresist 72. The second front electrolytic Cu portions 100 and the second backside electrolytic Cu portions 102 may be formed simultaneously in an electrolytic plating bath. The thickness of the second front electrolytic Cu portions 100 and the second backside electrolytic Cu portions 102 may be from about 0.5 µm to about 4.0 µm, although lesser and greater thicknesses are also contemplated herein.

The density of the second front electrolytic Cu portions 100 and the second backside electrolytic Cu portions 102 is about 8.91 g/cm$^3$, which is the same as the density of the first front electrolytic Cu portions 80 and the first backside electrolytic Cu portions 82, and is thus equal to or greater than 8.90 g/cm$^3$.

Figure 7:
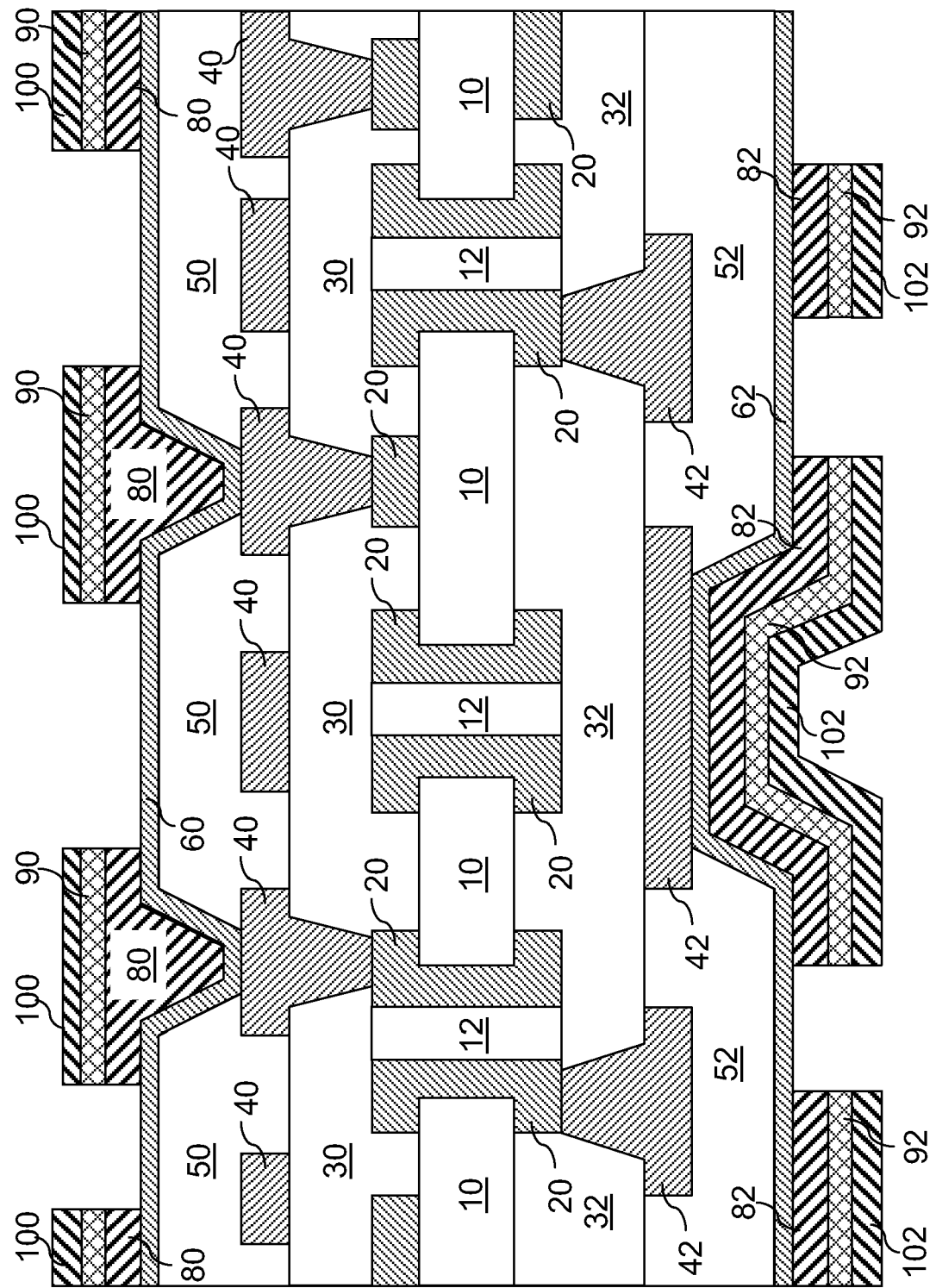

Referring to FIG. 7, the front photoresist 70 and the backside photoresist 72 are removed selectively to the second front electrolytic Cu portions 100, the second backside electrolytic Cu portions 102, the front electrolytic Ni portions 90, the backside electrolytic Ni portions 92, the first front electrolytic Cu portions 80, the first backside electrolytic Cu portions 82, the front electrolessly plated Cu layer 60, and the backside electrolessly plated Cu layer 62. For example, the front photoresist 70 and the backside photoresist 72 may be removed by a plasma ashing process.

Figure 8:
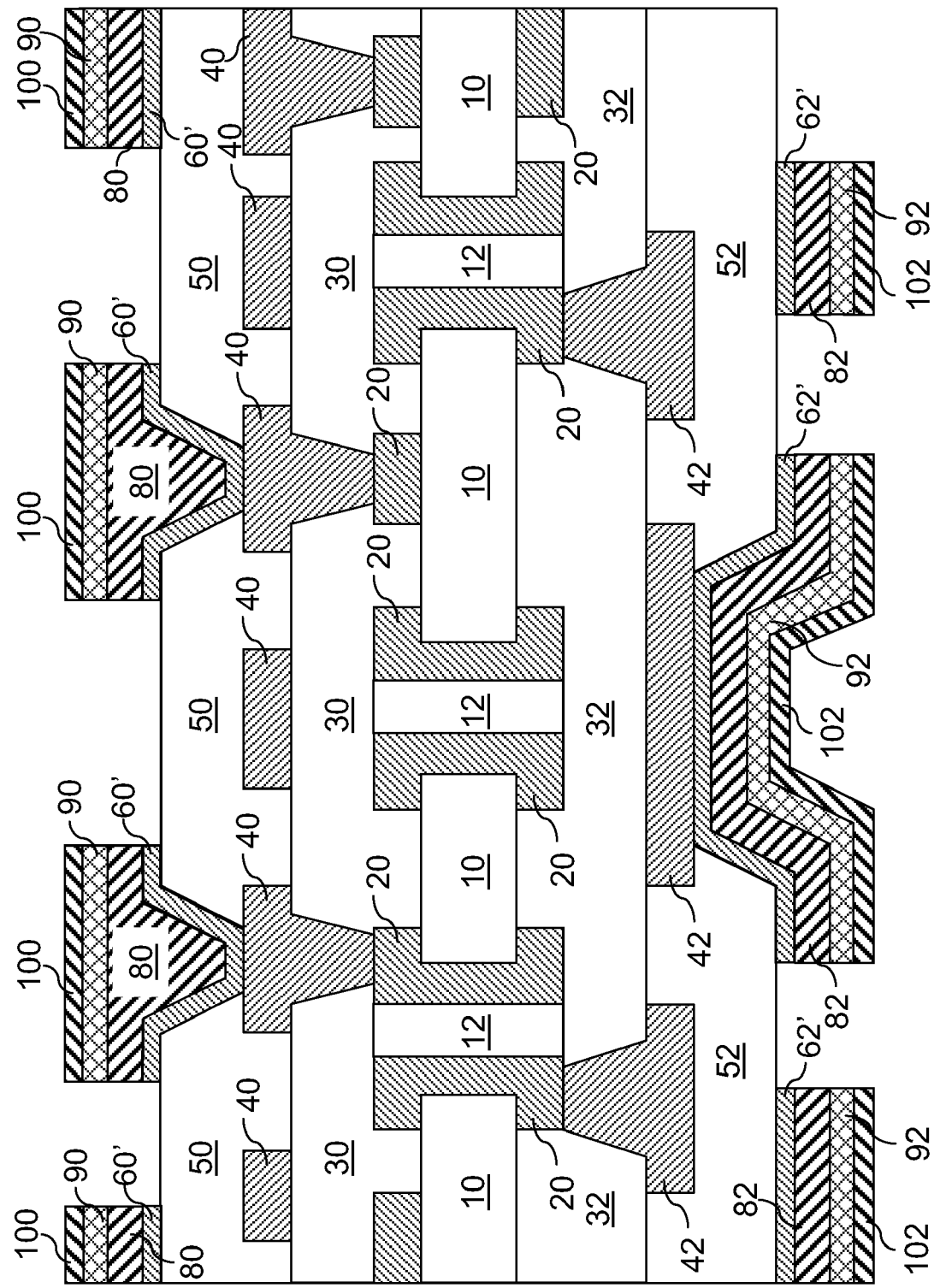

Referring to FIG. 8, exposed Cu surfaces are removed by an etch, which may employ a wet etching process or an anisotropic etching process. The etch rate and the duration of the etch are adjusted so that exposed portions of the front electrolessly plated Cu layer 60 and the backside electrolessly plated Cu layer 62 are removed by the etch. Thus, the front electrolessly plated Cu layer 60 turns into front electrolessly plated Cu portions 60', which are located only beneath the first front electrolytic Cu portions 80. Likewise, the backside electrolessly plated Cu layer 62 turns into backside electrolessly plated Cu portions 62', which are located only beneath (or above depending on the direction of observation) the first backside electrolytic Cu portions 82.

The thickness of the second front electrolytic Cu portions 100 and the second backside electrolytic Cu portions 102 is reduced by this etch, and may be from about 0.1 μm to about 4.0 μm, although lesser and greater thicknesses are also contemplated herein.

At this point, at least one C4 pad comprising a second front electrolytic Cu portion 100, a front electrolytic Ni portion 90, a first front electrolytic Cu portion 80, and a front electrolessly plated Cu portion 60' is formed on the front metal interconnect layer (40, 50). Each of the second front electrolytic Cu portion 100, the front electrolytic Ni portion 90, the first front electrolytic Cu portion 80, and the front electrolessly plated Cu portion 60' within the same C4 pad (60', 80, 90, 100) has sidewalls which are substantially vertically coincident among one another.

Likewise, at least one ball grid array (BGA) pad comprising a second backside electrolytic Cu portion 102, a backside electrolytic Ni portion 92, a first backside electrolytic Cu portion 82, and a backside electrolessly plated Cu portion 62' is formed on the backside metal interconnect layer (42, 52). Each of the second backside electrolytic Cu portion 102, the backside electrolytic Ni portion 92, the first backside electrolytic Cu portion 82, and the backside electrolessly plated Cu portion 62' within the same BGA pad (62', 82, 92, 102) has sidewalls which are substantially vertically coincident among one another.

Figure 9:
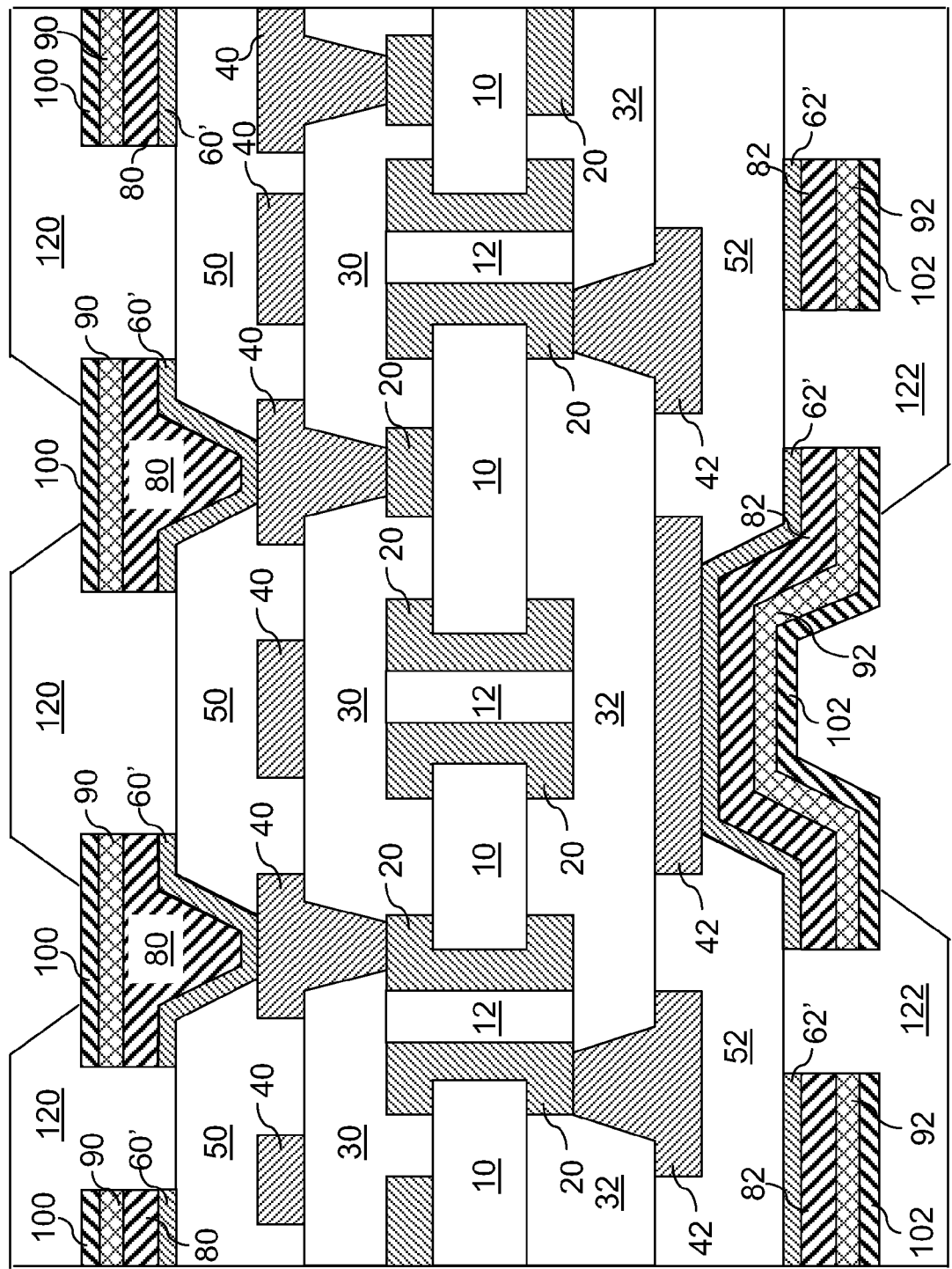

Referring to FIG. 9, a front solder mask 120 is formed on the at least one C4 pad (60', 80, 90, 100) and the front metal interconnect layer (40, 50), and a backside solder mask 122 is formed on the at least one BGA pad (62', 82, 92, 102) and the backside metal interconnect layer (42, 52). The front solder mask 120 and the backside solder mask 122 comprises a solder mask material known in the art, which may be, for example, photosensitive polyimide. The second front electrolytic Cu portions 100 and the second backside electrolytic Cu portions 102 serve as adhesive surfaces for the front solder mask 120 and the backside solder mask 122. It is noted that a Ni surface does not provide an adhesive surface, and a Cu surface is typically required to enable adhesion of the front solder mask 120 and the backside solder mask 122.

Figure 10:
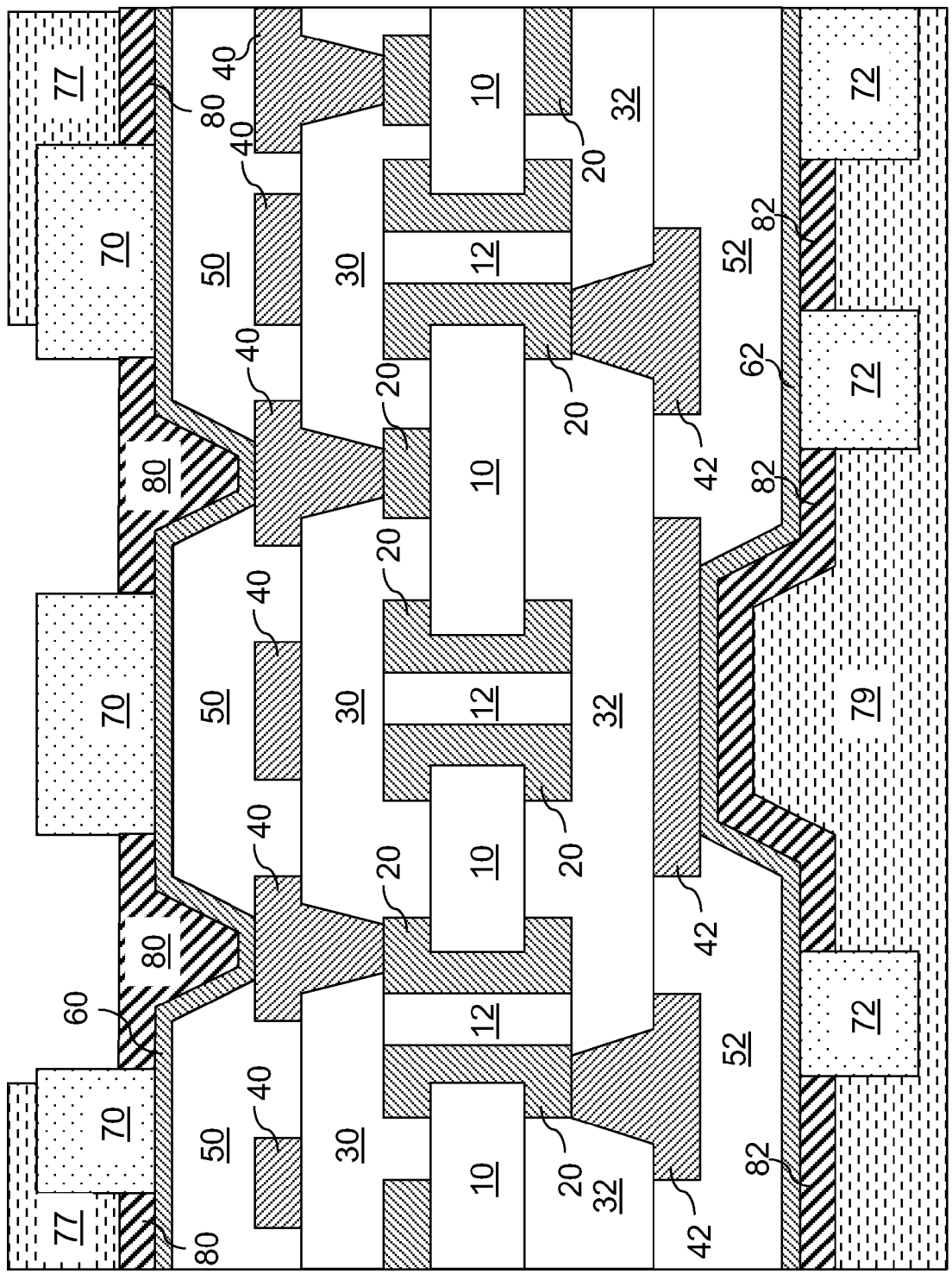
FIGS. 10-15 shows sequential vertical cross-sectional views of a second exemplary packaging substrate for mounting a semiconductor chip at various stages of a manufacturing sequence.

Referring to FIG. 10, a second exemplary packaging substrate according to a second embodiment of the present invention is derived from the first exemplary packaging substrate of FIG. 4 by applying a front dry laminating layer 77 to the front side of the first exemplary packaging substrate and applying a backside dry laminating layer 79 to the back side of the first exemplary packaging substrate. The front dry laminating layer 77 and the backside dry laminating layer 79 may comprises a photosensitive polymer. The front dry laminating layer 77 is lithographically patterned to expose some of the first front electrolytic Cu portions 80, while covering some others of the first front electrolytic Cu portions 80. The backside dry laminating layer 79 may, or may not, be lithographically patterned. If the backside dry laminating layer 79 is lithographically patterned, some of the backside front electrolytic Cu portions 82 are exposed, while some others of the first backside electrolytic Cu portions 82 are covered. If the backside dry laminating layer 79 is not lithographically patterned, the entirety of the first backside electrolytic Cu portions 82 is covered by the backside dry laminating layer 79. While the present invention is described for the case in which the backside dry laminating layer 79 is not lithographically patterned, a variation of the second exemplary packaging substrate in which the backside dry laminating layer 79 is patterned to expose some of the first backside electrolytic Cu portions 82 is explicitly contemplated herein.

Figure 11:
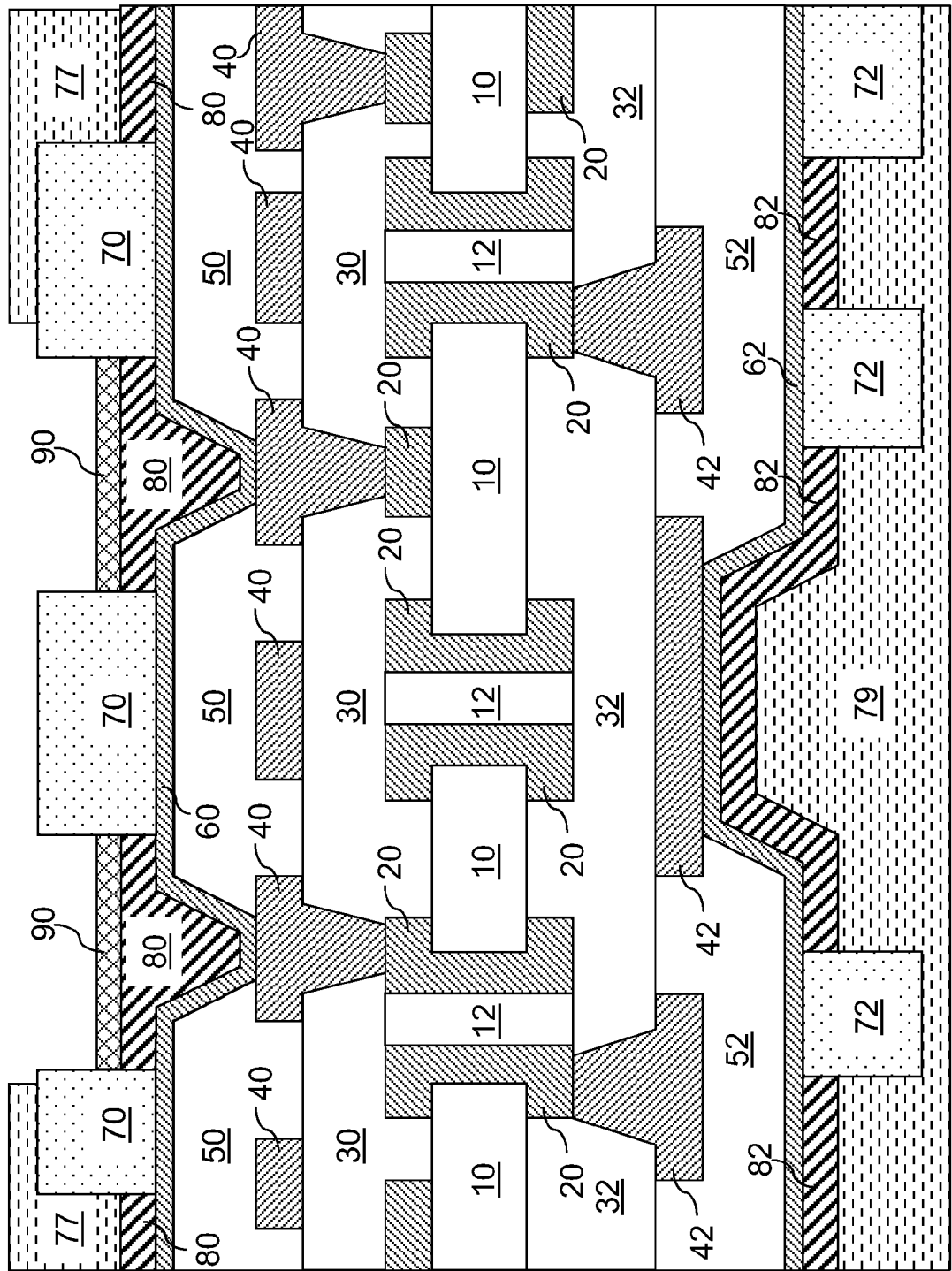

Referring to FIG. 11, front electrolytic Ni portions 90 are formed on exposed surfaces of the first front electrolytic Cu portions 80 by electrolytic plating of Ni on exposed surfaces of Cu as in the first embodiment. Due to the presence of the front dry laminating layer 77 and the front photoresist 70, the front electrolytic Ni portions 90 only on the exposed portions of the first front electrolytic Cu portions 80. The composition and the thickness of the front electrolytic Ni portions 90 are the same as in the first embodiment.

Figure 12:
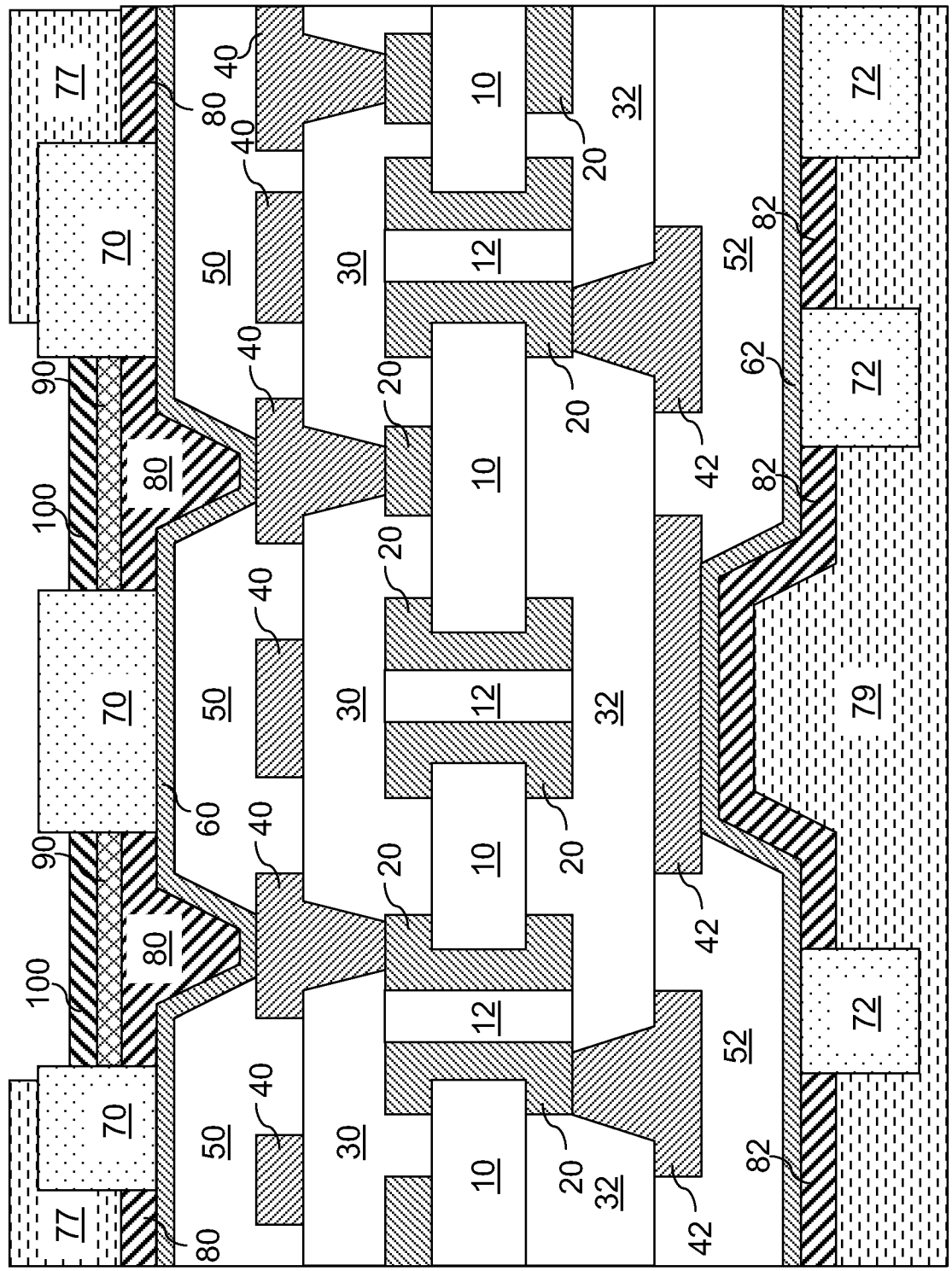

Referring to FIG. 12, second front electrolytic Cu portions 100 are formed on exposed surfaces of the front electrolytic Ni portions 90 by electrolytic plating of Cu on exposed surfaces of Ni. The front dry laminating layer 77 and the front photoresist 70 define the area in which the second front electrolytic Cu portions 100 are formed. The sidewalls of the second front electrolytic Cu portions 100 coincide with the sidewalls of the front electrolytic Ni portions 90 and the first front electrolytic Cu portions 80 directly underneath. The composition and the thickness of the second front electrolytic Cu portions 100 are the same as in the first embodiment.

Figure 13:
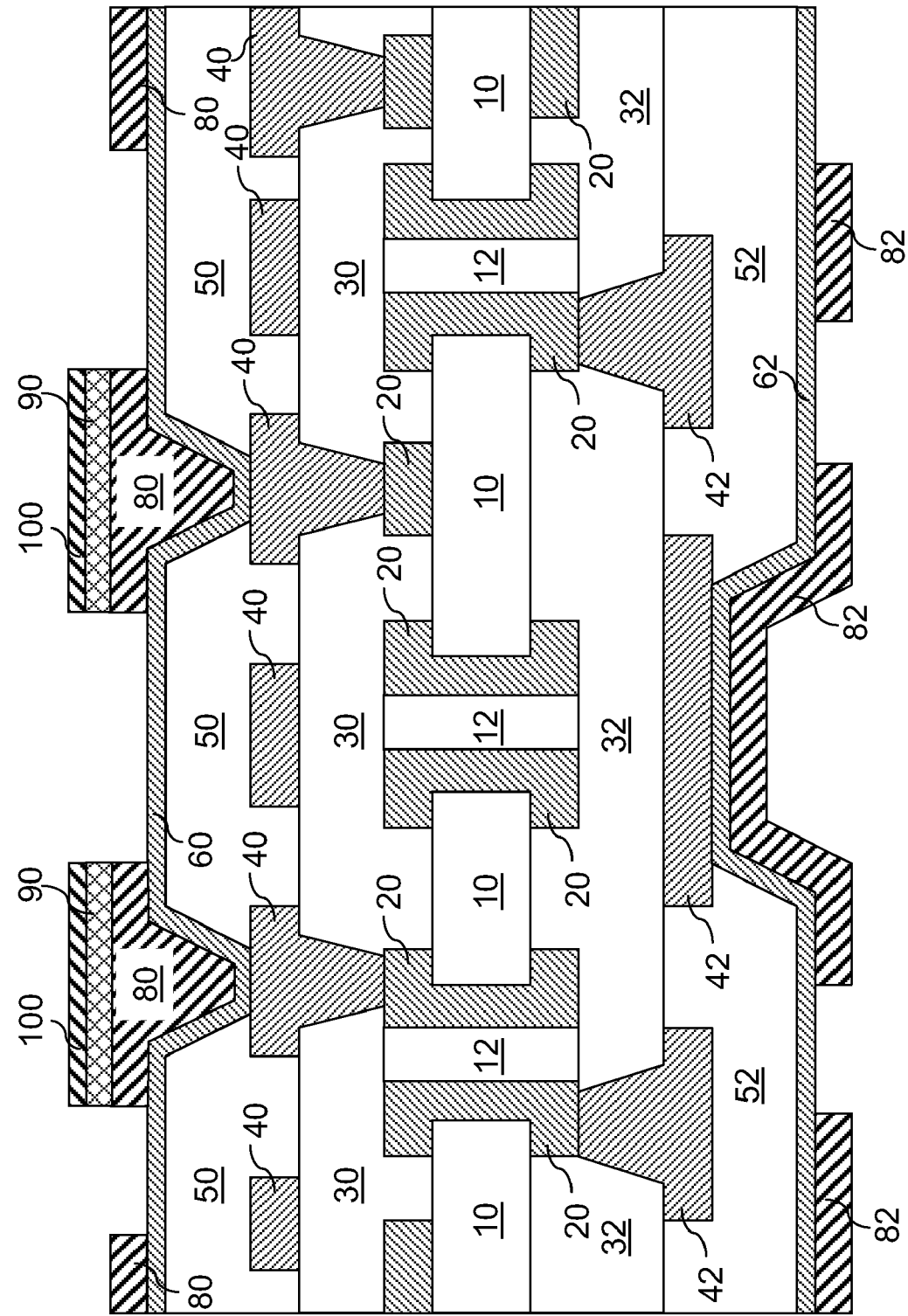

Referring to FIG. 13, the front dry laminating layer 77, the backside dry laminating layer 79, the front photoresist 70, and the backside photoresist 72 are removed selectively to the second front electrolytic Cu portions 100, the front electrolytic Ni portions 90, the first front electrolytic Cu portions 80, the first backside electrolytic Cu portions 82, the front electrolessly plated Cu layer 60, and the backside electrolessly plated Cu layer 62. For example, the front dry laminating layer 77, the backside dry laminating layer 79, the front photoresist 70, and the backside photoresist 72 may be removed by a plasma ashing process.

Figure 14:
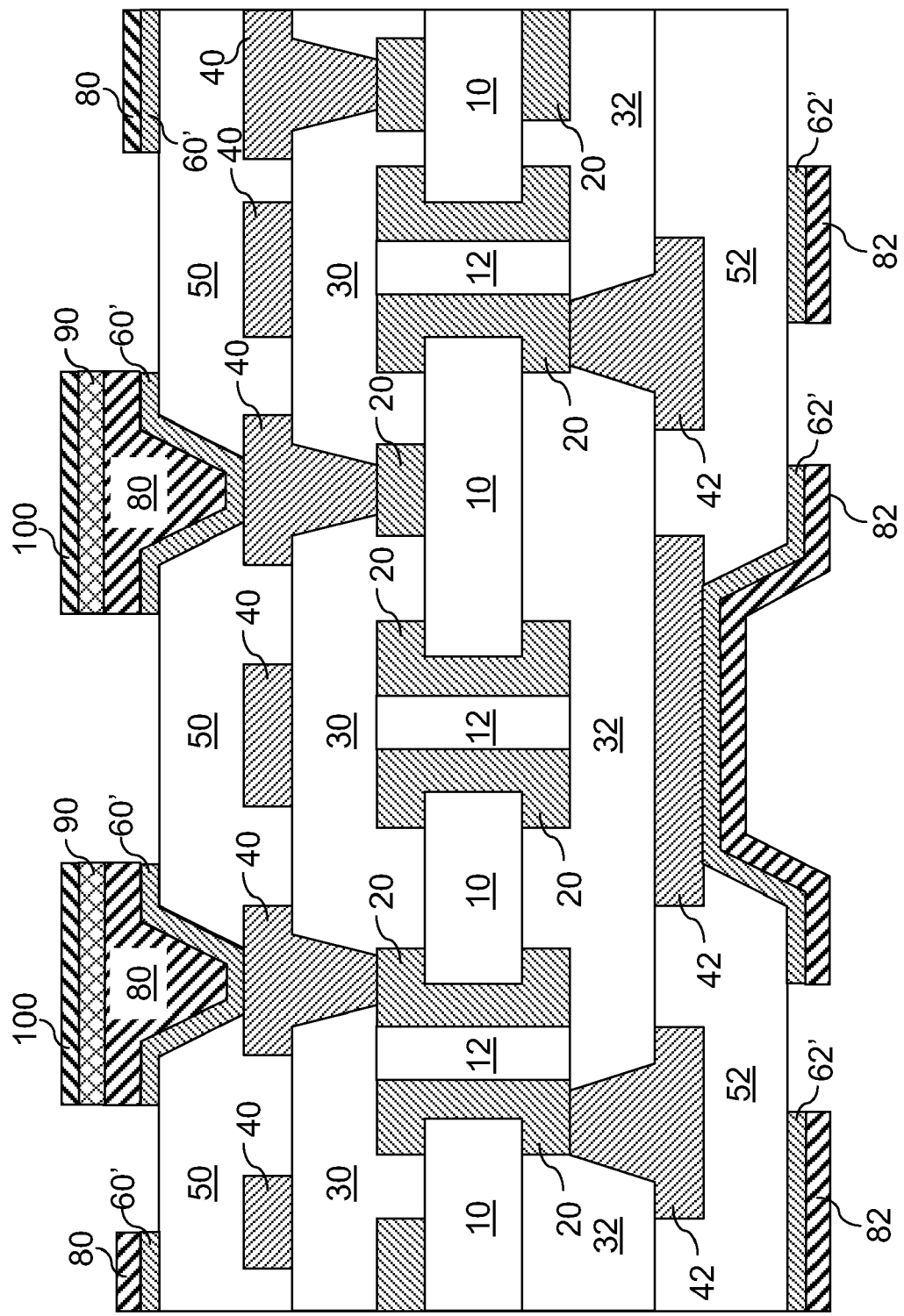

Referring to FIG. 14, exposed Cu surfaces are removed by an etch, which may employ a wet etching process or an anisotropic etching process. The etch rate and the duration of the etch are adjusted so that exposed portions of the front electrolessly plated Cu layer 60 and the backside electrolessly plated Cu layer 62 are removed by the etch. Thus, the front electrolessly plated Cu layer 60 turns into front electrolessly plated Cu portions 60', which are located only beneath the first front electrolytic Cu portions 80. Likewise, the backside electrolessly plated Cu layer 62 turns into backside electrolessly plated Cu portions 62', which are located only beneath (or above depending on the direction of observation) the first backside electrolytic Cu portions 82.

The thickness of the second front electrolytic Cu portions 100 and the second backside electrolytic Cu portions 102 is reduced by this etch, and may be from about 0.1 μm to about 4.0 μm, although lesser and greater thicknesses are also contemplated herein.

At this point, at least one C4 pad comprising a second front electrolytic Cu portion 100, a front electrolytic Ni portion 90, a first front electrolytic Cu portion 80, and a front electrolessly plated Cu portion 60' is formed on the front metal interconnect layer (40, 50). Each of the second front electrolytic Cu portion 100, the front electrolytic Ni portion 90, the first front electrolytic Cu portion 80, and the front electrolessly plated Cu portion 60' within the same C4 pad (60', 80, 90, 100) has sidewalls which are substantially vertically coincident among one another.

A metallic stack comprising a front electrolessly plated Cu portion 60' and a first front electrolytic Cu portion 80 and not contacting any front electrolytic Ni portion may also be formed on the front metal interconnect layer (40, 50) within an area from which the front dry laminating layer 77 is removed.

At least one ball grid array (BGA) pad comprising a first backside electrolytic Cu portion 82 and a backside electrolessly plated Cu portion 62' is formed on the backside metal interconnect layer (42, 52). Each of the first backside electrolytic Cu portion 82 and the backside electrolessly plated Cu portion 62' within the same BGA pad (62', 82) has sidewalls which are substantially vertically coincident among one another.

Figure 15:
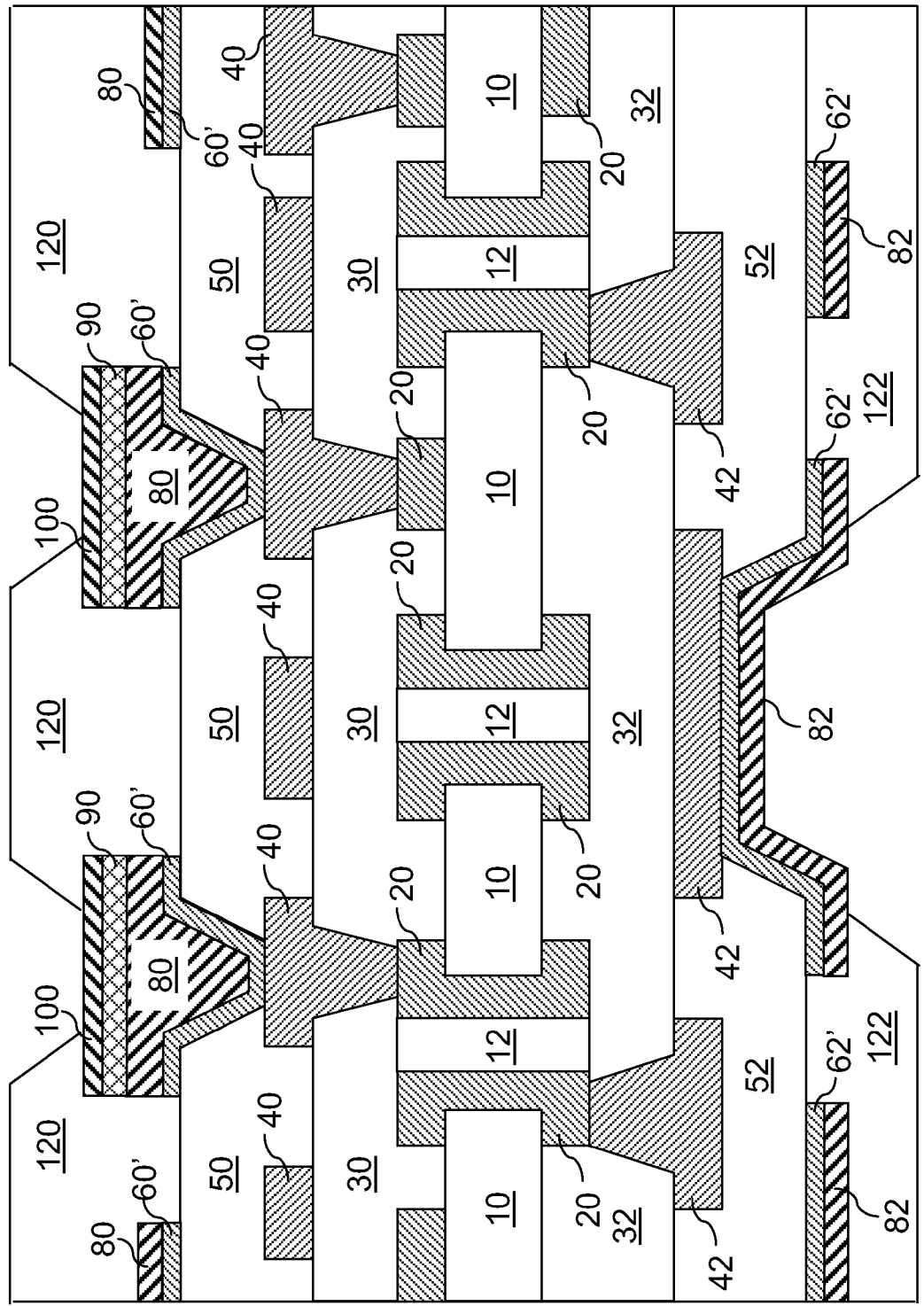

Referring to FIG. 15, a front solder mask 120 is formed on the at least one C4 pad (60', 80, 90, 100) and the front metal interconnect layer (40, 50), and a backside solder mask 122 is formed on the at least one BGA pad (62', 82) and the backside metal interconnect layer (42, 52). The front solder mask 120 and the backside solder mask 122 comprises a solder mask material known in the art, which may be, for example, photosensitive polyimide. The second front electrolytic Cu portions 100 and the first backside electrolytic Cu portions 82 serve as adhesive surfaces for the front solder mask 120 and the backside solder mask 122.

Figure 16:
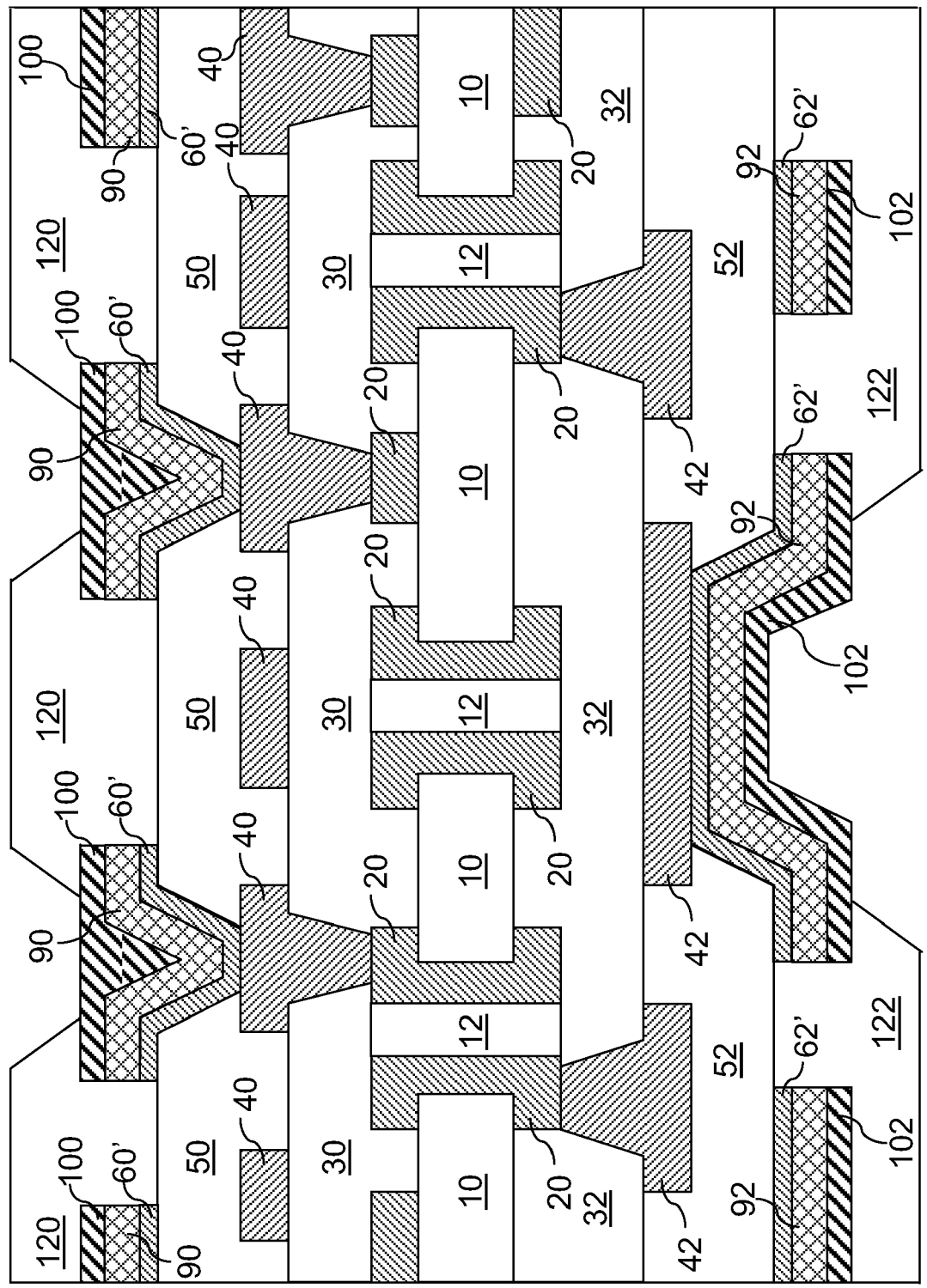
FIG. 16 shows a vertical cross-sectional view of a third exemplary packaging substrate.

Referring to FIG. 16, a third exemplary packaging substrate according to a third embodiment of the present invention is derived from the first exemplary packaging substrate by omitting a processing step for formation of the first front electrolytic Cu portions 80 and the first backside electrolytic Cu portions 82, which correspond to the step of FIG. 4. Thus, the front electrolytic Ni portions 90 are formed directly on the front electrolessly plated Cu layer 60, and the backside electrolytic Ni portions 92 are formed directly on the backside electrolessly plated Cu layer 62. The compositions and thicknesses of all common components are the same, and the same manufacturing method may be employed except for the omission of the step for formation of the first front electrolytic Cu portions 80 and the first backside electrolytic Cu portions 82.

The third exemplary packaging substrate comprises at least one C4 pad comprising a second front electrolytic Cu portion 100, a front electrolytic Ni portion 90, and a front electrolessly plated Cu portion 60' is formed on the front metal interconnect layer (40, 50). Each of the second front electrolytic Cu portion 100, the front electrolytic Ni portion 90, and the front electrolessly plated Cu portion 60' within the same C4 pad (60', 90, 100) has sidewalls which are substantially vertically coincident among one another.

Likewise, the third exemplary packaging substrate comprises at least one ball grid array (BGA) pad comprising a second backside electrolytic Cu portion 102, a backside electrolytic Ni portion 92, and a backside electrolessly plated Cu portion 62' is formed on the backside metal interconnect layer (42, 52). Each of the second backside electrolytic Cu portion 102, the backside electrolytic Ni portion 92, and the backside electrolessly plated Cu portion 62' within the same BGA pad (62', 92, 102) has sidewalls which are substantially vertically coincident among one another.

It is noted that designation of elements by the term "front" or "backside" refers only to the location of the element. Further, designation of elements by the term "first" or "second" is only for purposes of differentiating elements having similar or identical composition, and the use of the term "second" does not necessarily imply existence of a "first" element having the same or similar composition, for example, as in the case of the third embodiment.

The C4 pads of the present invention, and the BGA pads of the present invention in some embodiments, provide enhanced electromigration resistance due to the presence of a front electrolytic Ni portion 90 or a backside electrolytic Ni portions. This is because Ni and Ni intermetallics retard electromigration of Cu into the C4 solder ball or into the BGA ball. By retarding the transport of Cu into the solder, the mass of intermetallic formation is greatly reduced. When Cu (8.92 g/cm$^3$) and Sn (7.27 g/cm$^3$) interact, the intermetallic formation, $Cu_6Sn_5$ and $Cu_3Sn$, lead to a 5 to 7% reduction in volume which causes an open to occur. Further, the use of electrolytic Cu in the first front electrolytic Cu portions 80 and the first backside electrolytic Cu portions 82 provide enhanced resistance to electromigration relative to any prior art structures employing electrolessly plated Cu due to the higher density, i.e., due to the lower volume occupied by atomic level vacancies. Further, once all of the second front electrolytic Cu has reacted with the solder, the electrolytic Ni will react with the solder to produce a stable NiSn intermetallic that does not have a mechanical integrity problem. Whereas, with electroless NiP, the interaction with the solder leads to the formation of the "black pad" which does have mechanical integrity problems.

Figure 17A:
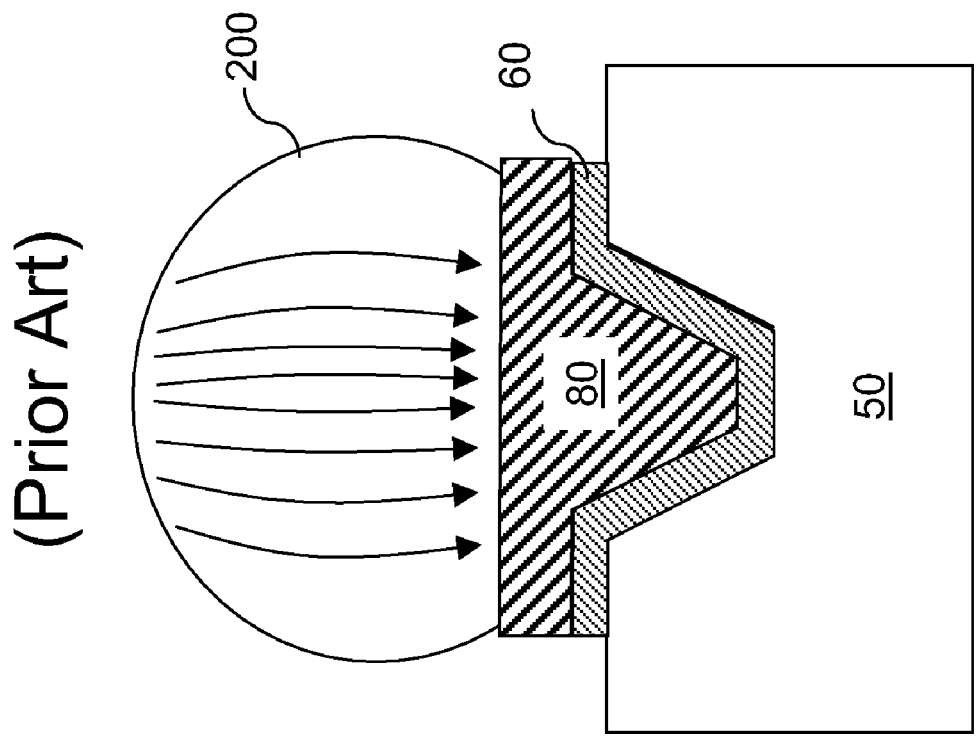
FIG. 17(a) schematically shows current distribution within a C4 ball that is attached to a C4 pad of the present invention, and FIG. 17(b) schematically shows current distribution within a C4 ball that is attached to a prior art C4 pad.
Figure 17B:
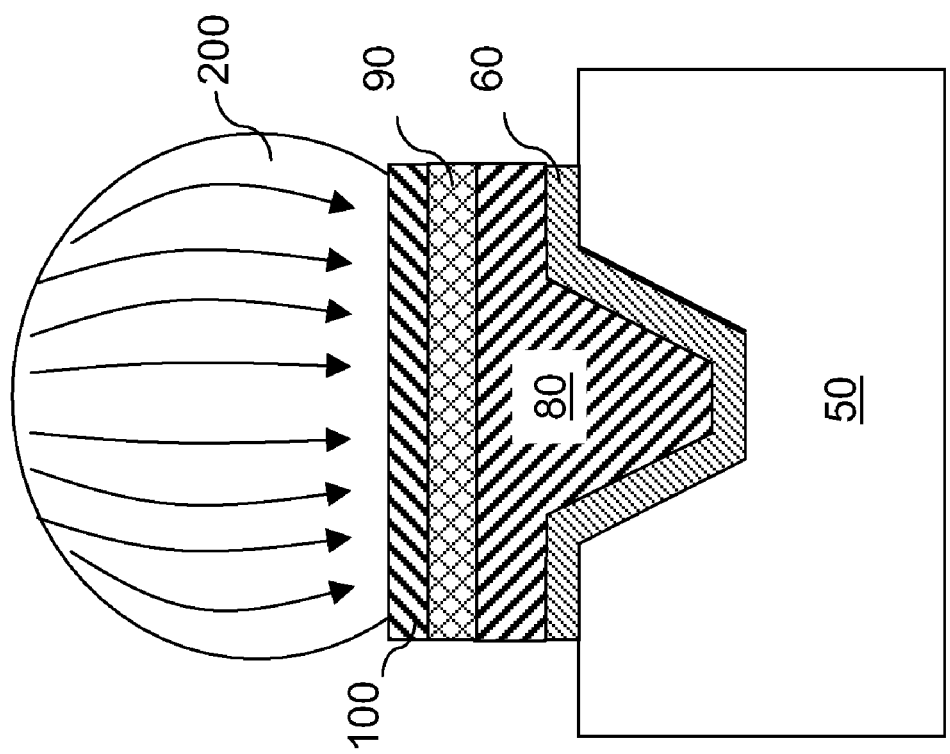

Referring to FIGS. 17(a) and 17(b), an additional advantage of the packaging substrates according to the present invention in promoting a more uniform distribution of current within a C4 ball is demonstrated schematically. Electrical current flows in the direction of the arrows and electrons, which cause electromigration by momentum transfer, flows in the opposite direction of the arrows. The density of arrows schematically represents the density of the electrical current. According to FIG. 17(a), a C4 ball is formed on an inventive C4 pad comprising a second front electrolytic Cu portion 100, a front electrolytic Ni portion 90, a first front electrolytic Cu portion 80, and a front electrolessly plated Cu portion 60'. The C4 ball is connected to a current source, which may be another C4 pad attached to a semiconductor chip, so that current flows through the C4 ball and the inventive C4 pad. According to FIG. 17(b), a C4 ball is formed on a prior art C4 pad consisting of an electrolessly plated Cu portion 61 and an electrolytic Cu portion 81.

The current distribution within the C4 ball on the inventive C4 pad is more uniform than the current distribution within the C4 ball on the prior art C4 pad because of the higher resistivity of Ni in the front electrolytic Ni portion 90 relative to Cu. The higher resistivity of Ni in the front electrolytic Ni portion 90 "spreads" the current in the C4 ball more uniformly compared a C4 ball formed on a prior art C4 pad. The maximum local current density within the C4 ball over the inventive C4 pad is less than the maximum local current density within the C4 ball over the prior art C4 pad, and as a consequence, the C4 ball formed on the inventive C4 pad is subjected to less electromigration, and is more reliable than the C4 ball formed on the prior art C4 pad structure. Thus, the inventive C4 pad structure enhances reliability of C4 balls formed thereupon.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A packaging substrate for mounting a semiconductor chip, said packaging substrate comprising:
   a core;
   a front metal interconnect layer containing front metal interconnect components and an insulator material including a topmost front insulator layer and located on and above a top surface of said core;

a backside metal interconnect layer containing backside metal interconnect components and said insulator material and located on and below a bottom surface of said core; and a C4 pad filling said opening and comprising, from bottom to top, an insulator-contacting Cu portion including atomic scale voids therein and having a first density that is lower than density of copper in an elemental form that does not have atomic scale voids and contacting one of said front metal interconnect components, a first Cu portion having a second density that is greater than said first density and lower than said density of copper in said elemental form that does not have atomic scale voids and contacting said insulator-contacting Cu portion, a Ni portion contacting said first Cu portion, and a second Cu portion having said second density and contacting said Ni portion, wherein a bottom surface of said insulator-contacting Cu portion contacts an insulator surface.

2. The packaging substrate of claim 1, wherein said a first density is less than 8.90 g/cm$^3$, wherein said second density is equal to or greater than 8.90 g/cm$^3$, and wherein said Ni portion has a specific gravity equal to or greater than 8.80 g/cm$^3$.

3. The packaging substrate of claim 1, wherein said Ni portion comprises at least 99.0% elemental Ni.

4. The packaging substrate of claim 1, wherein each of said insulator-contacting Cu portion, said first Cu portion, said Ni portion, and said second Cu portion has sidewalls that are substantially vertically coincident among one another.

5. The packaging substrate of claim 4, further comprising a front solder mask abutting said front metal interconnect layer and said sidewalls of said insulator-contacting Cu portion, said first Cu portion, said Ni portion, and said second Cu portion.

6. The packaging substrate of claim 1, further comprising a ball grid array pad abutting said backside metal interconnect layer, wherein said ball grid array pad comprises another insulator-contacting Cu portion abutting said backside metal interconnect layer, another first Cu portion abutting said another insulator-contacting Cu portion, another Ni portion abutting said another first Cu portion, and another second Cu portion abutting said another Ni portion.

7. The packaging substrate of claim 6, further comprising a back solder mask abutting said backside metal interconnect layer and covering a portion of said another second Cu portion and exposing another portion of said another second Cu portion.

8. The packaging substrate of claim 6, wherein said another insulator-contacting Cu portion has a density less than 8.90 g/cm$^3$, wherein said another first Cu portion and said another second Cu portion have a specific gravity equal to or greater than 8.90 g/cm$^3$, and wherein said another Ni portion has a specific gravity equal to or greater than 8.80 g/cm$^3$.

9. The packaging substrate of claim 1, further comprising a ball grid array pad abutting said backside metal interconnect layer and a back solder mask abutting said backside metal interconnect layer, wherein said ball grid array pad comprises another insulator-contacting Cu portion abutting said backside metal interconnect layer and another first Cu portion abutting said another insulator-contacting Cu portion, and wherein said back solder mask covers a portion of said another first Cu portion and exposes another portion of said another first Cu portion.

10. The packaging substrate of claim 1, further comprising a metallic stack comprising another insulator-contacting Cu portion and another first Cu portion, wherein said metallic stack is encapsulated by said front metal interconnect layer and a front solder mask.

11. The packaging substrate of claim 1, wherein said insulator-contacting Cu portion has a thickness from about 0.1 µm to about 2.0 µm, said first Cu portion has a thickness from about 0.5 µm to about 40 µm, said Ni portion has a thickness from about 0.5 µm to about 4.0 µm, and a second Cu portion has a thickness from about 0.1 µm to about 4.0 µm.

12. The packaging substrate of claim 1, wherein each of said insulator-contacting Cu portion, said first Cu portion, said Ni portion, and said second Cu portion has sidewalls that are substantially vertically coincident among one another and located above a topmost surface of said topmost front insulator layer.

13. The packaging substrate of claim 1, wherein said topmost front insulator layer has a topmost surface that is more distal from said core than topmost surfaces of said front metal interconnect components, and said topmost front insulator layer includes an opening that overlies one of said front metal interconnect components.

14. The packaging substrate of claim 13, wherein each of said insulator-contacting Cu portion, said first Cu portion, said Ni portion, and said second Cu portion has sidewalls that are substantially vertically coincident among one another and located above said topmost surface of said topmost front insulator layer.

15. A packaging substrate for mounting a semiconductor chip, said packaging substrate comprising:
a core;
a front metal interconnect layer containing front metal interconnect components and an insulator material including a topmost front insulator layer and located on and above a top surface of said core;
a backside metal interconnect layer containing backside metal interconnect components and said insulator material and located on and below a bottom surface of said core; and
a C4 pad filling said opening and comprising, from bottom to top, an insulator-contacting Cu portion including atomic scale voids therein and having a first density that is lower than density of copper in an elemental form that does not have atomic scale voids and contacting one of said front metal interconnect components, an Ni portion contacting said insulator-contacting Cu portion, and an Cu portion having a second density that is greater than said first density and lower than said density of copper in said elemental form that does not have atomic scale voids and contacting said Ni portion, wherein a bottom surface of said insulator-contacting Cu portion contacts an insulator surface.

16. The packaging substrate of claim 15, wherein said first density is less than 8.90 g/cm$^3$, wherein said second density is equal to or greater than 8.90 g/cm$^3$, and wherein said Ni portion has a specific gravity equal to or greater than 8.80 g/cm$^3$.

17. The packaging substrate of claim 15, wherein said Ni portion comprises at least 99.0% elemental Ni.

18. The packaging substrate of claim 15, wherein each of said insulator-contacting Cu portion, said Ni portion, and said Cu portion has sidewalls that are substantially vertically coincident among one another and located above a topmost surface of said topmost front insulator layer.

19. The packaging substrate of claim 15, wherein said topmost front insulator layer has a topmost surface that is more distal from said core than topmost surfaces of said front metal interconnect components, and said topmost front insulator layer includes an opening that overlies one of said front metal interconnect components.

20. The packaging substrate of claim 19, wherein each of said insulator-contacting Cu portion, said Ni portion, and said Cu portion has sidewalls that are substantially vertically coincident among one another and located above said topmost surface of said topmost front insulator layer.

* * * * *